(12) United States Patent
Kamal et al.

(10) Patent No.: US 10,062,680 B2
(45) Date of Patent: Aug. 28, 2018

(54) SILICON-ON-INSULATOR (SOI) COMPLEMENTARY METAL OXIDE SEMICONDUCTOR (CMOS) STANDARD LIBRARY CELL CIRCUITS HAVING A GATE BACK-BIAS RAIL(S), AND RELATED SYSTEMS AND METHODS

(71) Applicant: QUALCOMM Incorporated, San Diego, CA (US)

(72) Inventors: Pratyush Kamal, San Diego, CA (US); Yang Du, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/272,981

(22) Filed: May 8, 2014

(65) Prior Publication Data

US 2015/0325563 A1 Nov. 12, 2015

(51) Int. Cl.
*H01L 27/02* (2006.01)
*H01L 27/092* (2006.01)
(Continued)

(52) U.S. Cl.
CPC ........ *H01L 27/0207* (2013.01); *H01L 27/092* (2013.01); *H01L 27/1203* (2013.01);
(Continued)

(58) Field of Classification Search
CPC ........... H01L 29/66484; H01L 29/7831; H01L 29/78645; H01L 29/78648; H01L 27/0694
See application file for complete search history.

(56) References Cited

U.S. PATENT DOCUMENTS

| | | |
|---|---|---|
| 5,038,112 A | 8/1991 | O'Neill |
| 5,956,627 A | 9/1999 | Goos |

(Continued)

FOREIGN PATENT DOCUMENTS

| | | |
|---|---|---|
| EP | 2577799 A1 | 4/2013 |
| JP | 2007073885 A | 3/2007 |

(Continued)

OTHER PUBLICATIONS

International Search Report and Written Opinion for PCT/US2015/025516, dated Jul. 3, 2015, 13 pages.

(Continued)

*Primary Examiner* — David Spalla
(74) *Attorney, Agent, or Firm* — Withrow & Terranova, PLLC

(57) ABSTRACT

Silicon-on-insulator (SOI) complementary metal oxide semiconductor (CMOS) standard library cell circuits having gate back-bias rail(s) are disclosed. Related systems and methods are also disclosed. In one aspect, a SOI CMOS standard library cell circuit is provided that is comprised of one or more standard library cells. Each standard library cell includes one or more PMOS channel regions and one or more NMOS channel regions. Each standard library cell has one or more gate back-bias rails disposed adjacent to PMOS and NMOS channel regions. The gate back-bias rails are configured to apply bias voltages to corresponding PMOS and NMOS channel regions to adjust threshold voltages of PMOS and NMOS transistors associated with the PMOS and NMOS channel regions, respectively. Voltage biasing can be controlled to adjust timing of an IC using SOI CMOS standard library cell circuits to achieve design timing targets without including timing closure elements that consume additional area.

9 Claims, 13 Drawing Sheets

(51) Int. Cl.
*H01L 27/12* (2006.01)
*H03K 3/012* (2006.01)
*H01L 29/78* (2006.01)
*H01L 29/786* (2006.01)

(52) U.S. Cl.
CPC .... *H01L 29/7831* (2013.01); *H01L 29/78696* (2013.01); *H03K 3/012* (2013.01)

(56) References Cited

U.S. PATENT DOCUMENTS

| | | | |
|---|---|---|---|
| 6,100,567 A | 8/2000 | Burr | |
| 6,118,409 A | 9/2000 | Pietsch et al. | |
| 6,178,310 B1 | 1/2001 | Jeong, II | |
| 6,362,685 B1 | 3/2002 | Vagher | |
| 6,727,152 B2 | 4/2004 | Mitani et al. | |
| 7,115,460 B2 | 10/2006 | Shaw et al. | |
| 7,652,330 B1* | 1/2010 | Hackler, Sr. | H01L 21/2256 257/347 |
| 8,058,137 B1 | 11/2011 | Or-Bach et al. | |
| 8,431,994 B2* | 4/2013 | Chan | H01L 21/7624 257/345 |
| 8,432,216 B2 | 4/2013 | Mazure et al. | |
| 8,443,306 B1 | 5/2013 | Dhong et al. | |
| 8,575,697 B2 | 11/2013 | Mazure et al. | |
| 9,634,697 B2 | 4/2017 | Natesan et al. | |
| 2003/0228891 A1 | 12/2003 | Kobayashi et al. | |
| 2005/0215198 A1 | 9/2005 | Fifield | |
| 2005/0255809 A1 | 11/2005 | Glueck | |
| 2005/0275038 A1* | 12/2005 | Shih | H01L 29/78633 257/382 |
| 2007/0020837 A1* | 1/2007 | Bryant | H01L 21/84 438/199 |
| 2007/0093282 A1 | 4/2007 | Chang et al. | |
| 2007/0238496 A1 | 10/2007 | Chung et al. | |
| 2007/0250139 A1 | 10/2007 | Kanzius | |
| 2008/0180169 A1 | 7/2008 | Ripley et al. | |
| 2008/0319285 A1 | 12/2008 | Hancock | |
| 2009/0167457 A1 | 7/2009 | Melde et al. | |
| 2010/0008455 A1 | 1/2010 | Willgert | |
| 2010/0222012 A1 | 9/2010 | Shibuya et al. | |
| 2010/0296564 A1 | 11/2010 | Aryanfar et al. | |
| 2011/0024755 A1* | 2/2011 | Korenari | H01L 27/1214 257/59 |
| 2011/0049631 A1 | 3/2011 | Itaka | |
| 2011/0250926 A1 | 10/2011 | Wietfeldt et al. | |
| 2012/0168863 A1* | 7/2012 | Zhu | H01L 21/84 257/347 |
| 2012/0313182 A1* | 12/2012 | Huguenin | H01L 21/82345 257/369 |
| 2013/0038387 A1 | 2/2013 | Schmidhammer et al. | |
| 2013/0122829 A1 | 5/2013 | Hyvonen et al. | |
| 2013/0214356 A1 | 8/2013 | Cheng et al. | |
| 2013/0241796 A1 | 9/2013 | Nagumo | |
| 2013/0322562 A1 | 12/2013 | Zhang et al. | |
| 2014/0192845 A1 | 7/2014 | Szini et al. | |
| 2015/0022237 A1* | 1/2015 | Ferrant | H03K 19/17764 326/41 |
| 2015/0038094 A1 | 2/2015 | Maxim et al. | |
| 2015/0072632 A1 | 3/2015 | Pourkhaatoun et al. | |
| 2016/0173172 A1 | 6/2016 | Greene | |
| 2016/0277129 A1 | 9/2016 | Manssen et al. | |
| 2017/0026020 A1 | 1/2017 | Solomko et al. | |

FOREIGN PATENT DOCUMENTS

| | | |
|---|---|---|
| KR | 20070033509 A | 3/2007 |
| WO | 2011084715 A1 | 7/2011 |

OTHER PUBLICATIONS

Second Written Opinion for PCT/US2015/025516, dated Apr. 29, 2016, 10 pages.
International Preliminary Report on Patentability for PCT/US2015/025516, dated Jul. 20, 2016, 35 pages.

\* cited by examiner

SILICON-ON-INSULATOR (SOI) COMPLEMENTARY METAL OXIDE SEMICONDUCTOR (CMOS) STANDARD LIBRARY CELL CIRCUITS HAVING A GATE BACK-BIAS RAIL(S), AND RELATED SYSTEMS AND METHODS

BACKGROUND

I. Field of the Disclosure

The technology of the disclosure relates generally to complementary metal oxide semiconductor (CMOS) standard library cell circuits, and specifically to adjusting threshold voltages of transistors within such circuits.

II. Background

Processor-based computer systems can include a vast array of integrated circuits (ICs). Each IC has a complex layout design comprised of multiple IC devices. Standard library cell circuits are often employed to assist in making the design of such ICs less complex and more manageable. In particular, standard library cell circuits provide a designer with pre-designed cells corresponding to commonly used IC devices that conform to specific design rules of a chosen technology. As non-limiting examples, standard library cell circuits may include gates, inverters, multiplexers, and adders. Using standard library cell circuits enables a designer to create ICs having consistent layout designs, thereby creating a more uniform and less complex layout design across multiple ICs, as compared to custom designing each circuit.

However, multiple instances of an IC designed with standard library cell circuits can have different timing properties based on how manufacturing process variations affect the speed of the silicon die on which each instance of the IC is fabricated. For example, an IC fabricated on a first silicon die can have timing properties that vary from an identical IC fabricated on a second silicon die if the two silicon die have different speeds as a result of manufacturing process variations. In this manner, a silicon die can have a corresponding speed that is considered slow, typical, or fast as compared to the expected speed of silicon. Thus, an IC can be designed using standard library cell circuits to meet a specific design timing target, but variations in the speed of silicon as a result of manufacturing process variations can require additional steps to remedy the timing differences existing between separate instances of the IC.

One solution to overcome timing differences caused by varying silicon die speeds involves adding timing closure elements to an IC. For example, clock buffers may be added at various locations within the layout of an IC to adjust the timing of the IC to reach the design timing target. The timing closure elements can alter the timing of an IC so as to overcome a discrepancy in timing between the design timing target and the actual timing caused by the speed of the silicon. However, adding such timing closure elements to the IC layout design increases the area and power consumption of the IC. Thus, it would be advantageous if an IC designed with standard library cell circuits could achieve design timing targets without requiring timing closure elements to overcome timing discrepancies caused by silicon speeds.

SUMMARY OF THE DISCLOSURE

Aspects disclosed in the detailed description include silicon-on-insulator (SOI) complementary metal oxide semiconductor (CMOS) standard library cell circuits having a gate back-bias rail(s), and related systems and methods. In one aspect, a SOI CMOS standard library cell circuit is provided that is comprised of one or more standard library cells. Each standard library cell includes one or more p-type metal oxide semiconductor (PMOS) channel regions and one or more n-type metal oxide semiconductor (NMOS) channel regions. Further, each standard library cell has one or more gate back-bias rails disposed adjacent to the PMOS and NMOS channel regions. The gate back-bias rails are configured to apply bias voltages to corresponding PMOS and NMOS channel regions to adjust threshold voltages of PMOS and NMOS transistors associated with the PMOS and NMOS channel regions, respectively. Thus, the voltage biasing can be controlled to adjust timing of an integrated circuit (IC) using these SOI CMOS standard library cell circuits to achieve design timing targets without requiring inclusion of timing closure elements that consume additional area in the IC. Further, by the gate back-bias rails being provided in the standard library cell to apply bias voltages to the corresponding PMOS and NMOS channel regions therein, the bias voltages can be applied to the corresponding PMOS and NMOS channel regions as opposed to being applied to the entire well region of the standard library cell, thus allowing taps with a smaller area to be used to provide the bias voltages.

In this regard in one aspect, a SOI CMOS standard library cell circuit, comprising one or more standard library cells is provided. Each of the one or more standard library cells comprises one or more PMOS channel regions. Each of the one or more standard library cells further comprises one or more PMOS transistors, each associated with one of the one or more PMOS channel regions. Each of the one or more standard library cells further comprises one or more PMOS supply rails each configured to provide a supply voltage to a PMOS channel region among the one or more PMOS channel regions. Each of the one or more standard library cells further comprises one or more NMOS channel regions. Each of the one or more standard library cells further comprises one or more NMOS transistors, each associated with one of the one or more NMOS channel regions. Each of the one or more standard library cells further comprises one or more NMOS supply rails each configured to provide the supply voltage to an NMOS channel region among the one or more NMOS channel regions. Each of the one or more standard library cells further comprises one or more PMOS gate back-bias rails each disposed adjacent to a corresponding PMOS channel region among the one or more PMOS channel regions. Each of the one or more PMOS gate back-bias rails is configured to apply a PMOS bias voltage to the corresponding PMOS channel region to adjust a threshold voltage of the one or more PMOS transistors associated with the corresponding PMOS channel region. Each of the one or more standard library cells further comprises one or more NMOS gate back-bias rails each disposed adjacent to a corresponding NMOS channel region among the one or more NMOS channel regions. Each of the one or more NMOS gate back-bias rails is configured to apply an NMOS bias voltage to the corresponding NMOS channel region to adjust a threshold voltage of the one or more NMOS transistors associated with the corresponding NMOS channel region.

In another aspect, a SOI CMOS standard library cell circuit, comprising one or more standard library cells is provided. Each of the one or more standard library cells comprises one or more PMOS channel means. Each of the one or more standard library cells further comprises one or more PMOS transistor means, each associated with one of the one or more PMOS channel means. Each of the one or more standard library cells further comprises one or more means for providing a supply voltage to a PMOS channel means among the one or more PMOS channel means. Each of the one or more standard library cells further comprises one or more NMOS channel means. Each of the one or more standard library cells further comprises one or more NMOS transistor means, each associated with one of the one or more NMOS channel means. Each of the one or more standard library cells further comprises one or more means for providing the supply voltage to an NMOS channel means among the one or more NMOS channel means. Each of the one or more standard library cells further comprises one or more means for applying a PMOS bias voltage to a corresponding PMOS channel means to adjust a threshold voltage of the one or more PMOS transistor means associated with the corresponding PMOS channel means. Each of the one or more standard library cells further comprises one or more means for applying an NMOS bias voltage to a corresponding NMOS channel means to adjust a threshold voltage of the one or more NMOS transistor means associated with the corresponding NMOS channel means.

In another aspect, a method of adjusting threshold voltages of transistors in a SOI CMOS standard library cell is provided. The method comprises applying a supply voltage to a PMOS channel region among one or more PMOS channel regions. The method further comprises applying a PMOS bias voltage to one or more PMOS gate back-bias rails each disposed adjacent to a corresponding PMOS channel region among the one or more PMOS channel regions, to apply the PMOS bias voltage to the corresponding PMOS channel region to adjust a threshold voltage of one or more PMOS transistors associated with the corresponding PMOS channel region. The method further comprises applying the supply voltage to an NMOS channel region among one or more NMOS channel regions. The method further comprises applying an NMOS bias voltage to one or more NMOS gate back-bias rails each disposed adjacent to a corresponding NMOS channel region among the one or more NMOS channel regions, to apply the NMOS bias voltage to the corresponding NMOS channel region to adjust a threshold voltage of one or more NMOS transistors associated with the corresponding NMOS channel region.

In another aspect, an IC chip is provided. The IC chip comprises a plurality of ICs. Each IC of the plurality of ICs comprises a plurality of SOI CMOS standard library cell circuits, comprising one or more standard library cells. Each of the one or more standard library cells comprises one or more PMOS channel regions. Each of the one or more standard library cells further comprises one or more PMOS transistors, each associated with one of the one or more PMOS channel regions. Each of the one or more standard library cells further comprises one or more PMOS supply rails each configured to provide a supply voltage to a PMOS channel region among the one or more PMOS channel regions. Each of the one or more standard library cells further comprises one or more NMOS channel regions. Each of the one or more standard library cells further comprises one or more NMOS transistors, each associated with one of the one or more NMOS channel regions. Each of the one or more standard library cells further comprises one or more NMOS supply rails each configured to provide the supply voltage to an NMOS channel region among the one or more NMOS channel regions. Each of the one or more standard library cells further comprises one or more PMOS gate back-bias rails each disposed adjacent to a corresponding PMOS channel region among the one or more PMOS channel regions, each of the one or more PMOS gate back-bias rails configured to apply a PMOS bias voltage to the corresponding PMOS channel region to adjust a threshold voltage of the one or more PMOS transistors associated with the corresponding PMOS channel region. Each of the one or more standard library cells further comprises one or more NMOS gate back-bias rails each disposed adjacent to a corresponding NMOS channel region among the one or more NMOS channel regions, each of the one or more NMOS gate back-bias rails configured to apply an NMOS bias voltage to the corresponding NMOS channel region to adjust a threshold voltage of the one or more NMOS transistors associated with the corresponding NMOS channel region.

DETAILED DESCRIPTION

Figure 1A:
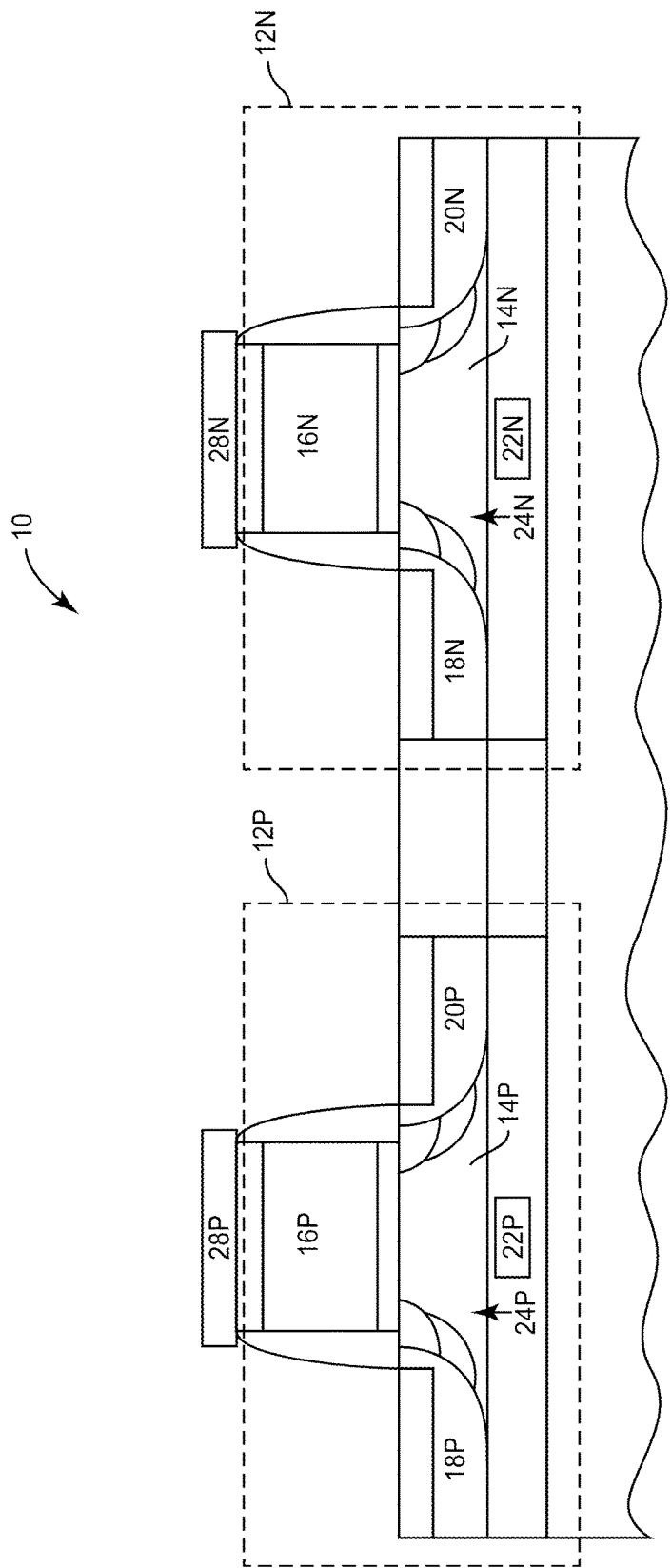
FIG. 1A is a cross-sectional view diagram of an exemplary silicon-on-insulator (SOI) complementary metal oxide semiconductor (CMOS) standard library cell circuit employing a p-type metal oxide semiconductor (PMOS) gate back-bias rail and an n-type metal oxide semiconductor (NMOS) gate back-bias rail, each configured to provide a bias voltage to a corresponding PMOS or NMOS channel region so as to adjust a threshold voltage ($V_t$) of a PMOS transistor and a $V_t$ of an NMOS transistor, respectively.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include silicon-on-insulator (SOI) complementary metal oxide semiconductor (CMOS) standard library cell circuits having a gate back-bias rail(s), and related systems and methods. In one aspect, a SOI CMOS standard library cell circuit is provided that is comprised of one or more standard library cells. Each standard library cell includes one or more p-type metal oxide semiconductor (PMOS) channel regions and one or more n-type metal oxide semiconductor (NMOS) channel regions. Further, each standard library cell has one or more gate back-bias rails disposed adjacent to the PMOS and NMOS channel regions. The gate back-bias rails are configured to apply bias voltages to corresponding PMOS and NMOS channel regions to adjust threshold voltages of PMOS and NMOS transistors associated with the PMOS and NMOS channel regions, respectively. Thus, the voltage biasing can be controlled to adjust timing of an integrated circuit (IC) using these SOI CMOS standard library cell circuits to achieve design timing targets without requiring inclusion of timing closure elements that consume additional area in the IC. Further, by the gate back-bias rails being provided in the standard library cell to apply bias voltages to the corresponding PMOS and NMOS channel regions therein, the bias voltages can be applied to the corresponding PMOS and NMOS channel regions as opposed to being applied to the entire well region of the standard cell, thus allowing taps with a smaller area to be used to provide the bias voltages.

Figure 1B:
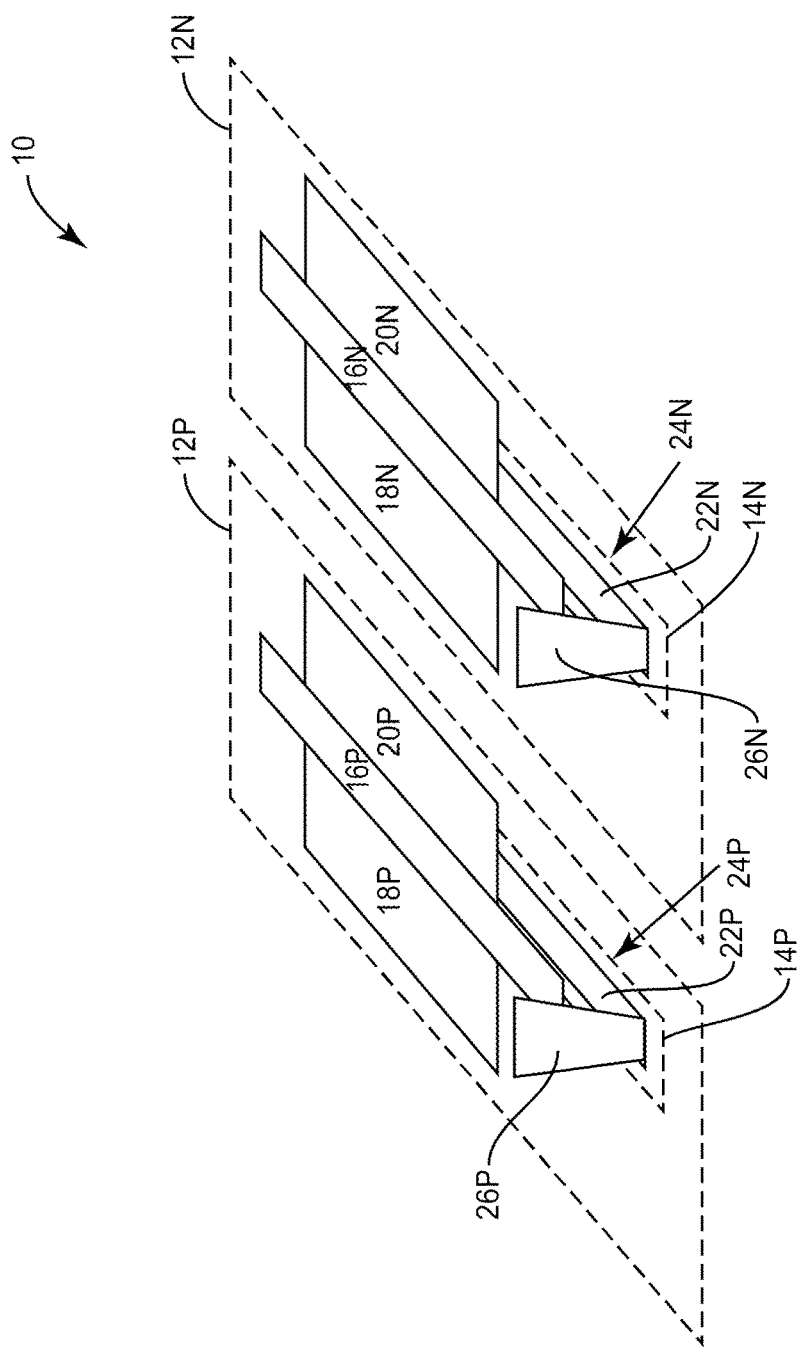
FIG. 1B is a perspective view diagram of the exemplary SOI CMOS standard library cell circuit in FIG. 1 employing the PMOS gate back-bias rail and the NMOS gate back-bias rail, each configured to provide the bias voltage to the corresponding PMOS or NMOS channel region so as to adjust the $V_t$ of the PMOS transistor and the $V_t$ of the NMOS transistor, respectively.

In this regard, FIG. 1A illustrates a cross-sectional view diagram of an exemplary SOI CMOS standard library cell circuit 10 that includes standard library cells employing gate back-bias rails. FIG. 1B illustrates a perspective view diagram of the SOI CMOS standard library cell circuit 10 in FIG. 1A. With reference to FIGS. 1A and 1B, the SOI CMOS standard library cell circuit 10 includes a PMOS transistor 12P associated with a PMOS channel region 14P.

The PMOS transistor 12P has a corresponding gate 16P, source 18P, and drain 20P. The SOI CMOS standard library cell circuit 10 also includes an NMOS transistor 12N associated with an NMOS channel region 14N. Similar to the PMOS transistor 12P, the NMOS transistor 12N has a corresponding gate 16N, source 18N, and drain 20N. A PMOS gate back-bias rail 22P is disposed adjacent to the PMOS channel region 14P. The PMOS gate back-bias rail 22P may be implemented with various materials, such as metal or polysilicon, as examples. The PMOS gate back-bias rail 22P is configured to apply a PMOS bias voltage 24P to the PMOS channel region 14P to adjust a threshold voltage $V_{t\text{-}PMOS}$ of the PMOS transistor 12P. Similarly, an NMOS gate back-bias rail 22N is disposed adjacent to the NMOS channel region 14N. The NMOS gate back-bias rail 22N may be implemented with various materials, such as metal or polysilicon, as examples. The NMOS gate back-bias rail 22N is configured to apply an NMOS bias voltage 24N to the NMOS channel region 14N to adjust a threshold voltage $V_{t\text{-}NMOS}$ of the NMOS transistor 12N. With particular reference to FIG. 1A, the SOI CMOS standard library cell circuit 10 also employs a PMOS supply rail 28P and an NMOS supply rail 28N configured to provide a supply voltage to the PMOS transistor 12P and the NMOS transistor 12N, respectively.

In this manner, employing the PMOS gate back-bias rail 22P and the NMOS gate back-bias rail 22N in the SOI CMOS standard library cell circuit 10 may reduce the area of an IC employing the SOI CMOS standard library cell circuit 10. For example, by adjusting the $V_{t\text{-}PMOS}$ of the PMOS transistor 12P and the $V_{t\text{-}NMOS}$ of the NMOS transistor 12N using the PMOS gate back-bias rail 22P and the NMOS gate back-bias rail 22N, respectively, an IC using the SOI CMOS standard library cell circuit 10 may achieve a design timing target without the addition of timing closure elements. More specifically, increasing the $V_{t\text{-}PMOS}$ may cause the PMOS transistor 12P to operate at a lower speed, while decreasing the $V_{t\text{-}PMOS}$ may cause the PMOS transistor 12P to operate at a higher speed. Similarly, increasing the $V_{t\text{-}NMOS}$ may cause the NMOS transistor 12N to operate at a lower speed, while decreasing the $V_{t\text{-}NMOS}$ may cause the NMOS transistor 12N to operate at a higher speed. Thus, the timing of an IC employing the SOI CMOS standard library cell circuit 10 may be adjusted by using the PMOS gate back-bias rail 22P and the NMOS gate back-bias rail 22N to adjust the timing of the PMOS transistor 12P and the NMOS transistor 12N, respectively, through voltage biasing. Adjusting the timing of an IC in this manner removes the need to insert timing closure elements into an IC, thus avoiding any corresponding increase in area and power consumption of the IC.

Further, as discussed above and as illustrated in FIGS. 1A and 1B, the PMOS gate back-bias rail 22P and the NMOS gate back-bias rail 22N are provided as part of a standard library cell employed in the SOI CMOS standard library cell circuit 10. A standard library cell is a cell that employs one or more PMOS channel regions and associated PMOS transistors, one or more NMOS channel regions and associated NMOS transistors, and PMOS and NMOS supply rails in a predesigned format in order to achieve a desired function. When the standard library cell as described herein is represented in a standard library cell definition form, the standard library cell also includes the PMOS gate back-bias rail 22P and the NMOS gate back-bias rail 22N. In particular, the PMOS gate back-bias rail 22P and the NMOS gate back-bias rail 22N will be disposed adjacent to the PMOS channel region 14P and the NMOS channel region 14N, respectively, in the standard library cell definition form. In this manner, if a designer employs the standard library cell when designing an IC that includes SOI CMOS standard library cell circuits like the SOI CMOS standard library cell circuit 10, the PMOS gate back-bias rail 22P and the NMOS gate back-bias rail 22N will automatically be included in the corresponding fabricated IC. Thus, additional design steps are not required to employ the PMOS gate back-bias rail 22P and the NMOS gate back-bias rail 22N in the IC. Because the PMOS gate back-bias rail 22P and the NMOS gate back-bias rail 22N are included as part of the IC employing the standard library cell, PMOS and NMOS bias voltages 24P, 24N may be applied to the IC to voltage bias the SOI CMOS standard library cell circuits included in the IC, as desired or needed.

With particular reference to FIG. 1B, a tap 26P is included in the SOI CMOS standard library cell circuit 10 to provide the PMOS bias voltage 24P to the PMOS gate back-bias rail 22P. Similarly, a tap 26N is also included in the SOI CMOS standard library cell circuit 10 to provide the NMOS bias voltage 24N to the NMOS gate back-bias rail 22N. Employing the PMOS gate back-bias rail 22P and the NMOS gate back-bias rail 22N may also reduce the area of an IC employing the SOI CMOS standard library cell circuit 10 by allowing smaller taps 26P, 26N to be used to provide the respective bias voltages 24P, 24N. In particular, by disposing the PMOS gate back-bias rail 22P in the PMOS channel region 14P, the PMOS bias voltage 24P is applied only to the PMOS channel region 14P. By disposing the NMOS gate back-bias rail 22N in the NMOS channel region 14N, the NMOS bias voltage 24N is applied only to the NMOS channel region 14N. Thus, taps 26P, 26N used to provide the PMOS bias voltage 24P and the NMOS bias voltage 24N to the PMOS channel region 14P and the NMOS channel region 14N, respectively, may be smaller than taps used to provide bias voltages to an entire well region of a CMOS circuit using bulk technology. In other words, because the PMOS channel region 14P and the NMOS channel region 14N in the SOI CMOS standard library cell circuit 10 are smaller in area as compared to a well region in bulk technology, the smaller taps 26P, 26N may be employed to distribute the respective bias voltages 24P, 24N to the PMOS channel region 14P and the NMOS channel region 14N. Therefore, by using the smaller taps 26P, 26N, the area of an IC employing the SOI CMOS standard library cell circuit 10 may be reduced as opposed to using a bulk technology CMOS circuit.

As discussed above, the PMOS gate back-bias rail 22P and the NMOS gate back-bias rail 22N in the SOI CMOS standard library cell circuit 10 in FIGS. 1A and 1B are configured to apply the respective bias voltages 24P, 24N so as to adjust a threshold voltage of only a single PMOS transistor 12P or NMOS transistor 12N, respectively. However, the PMOS gate back-bias rail 22P and the NMOS gate back-bias rail 22N may also be configured to apply each respective bias voltage 24P, 24N so as to adjust a threshold voltage of multiple transistors simultaneously.

Figure 2:
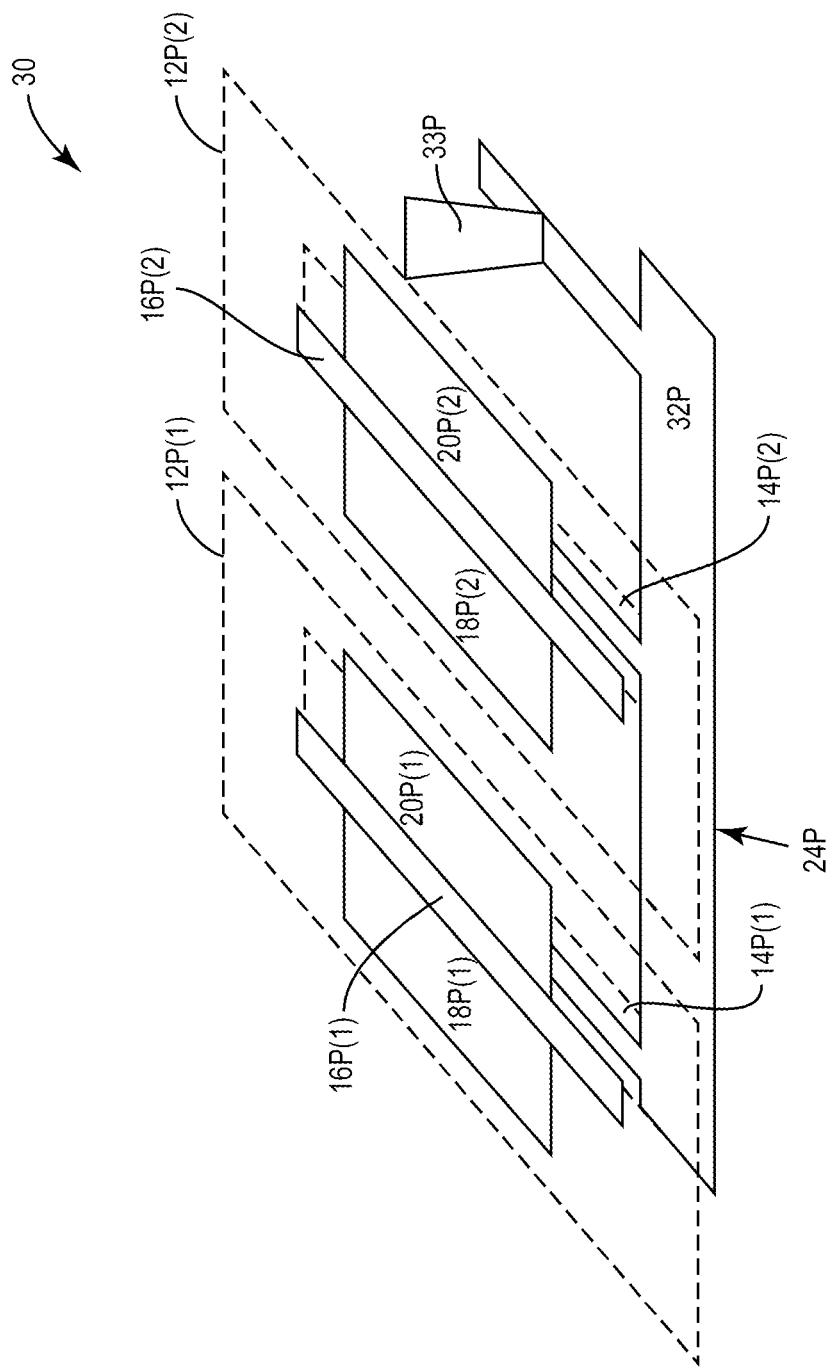
FIG. 2 is a perspective view diagram of two exemplary transistors for a SOI CMOS standard library cell circuit that includes a gate back-bias rail configured to apply a bias voltage to a respective channel region so as to adjust a $V_t$ of each transistor equally.

In this regard, FIG. 2 illustrates a perspective view diagram of a SOI CMOS standard library cell circuit 30 that includes a PMOS gate back-bias rail 32P configured to apply the PMOS bias voltage 24P so as to adjust the $V_{t\text{-}PMOS}$ of PMOS transistors 12P(1), 12P(2). The PMOS transistors 12P(1), 12P(2) have corresponding gates 16P(1), 16P(2), sources 18P(1), 18P(2), and drains 20P(1), 20P(2). Further, the PMOS gate back-bias rail 32P is disposed adjacent to both PMOS channel regions 14P(1), 14P(2). Thus, the PMOS gate back-bias rail 32P is configured to apply the PMOS bias voltage 24P to both of the PMOS channel regions 14P(1), 14P(2). A single tap 33P is also included in the SOI CMOS standard library cell circuit 30 to provide the PMOS bias voltage 24P to the PMOS gate back-bias rail 32P. This configuration allows the PMOS gate back-bias rail 32P to simultaneously adjust the $V_{t\text{-}PMOS}$ of the PMOS transistors 12P(1), 12P(2) using only the PMOS bias voltage 24P and the tap 33P. Thus, the timing of the PMOS transistors 12P(1), 12P(2), and the timing of an IC employing the SOI CMOS standard library cell circuit 30, may be adjusted using the single PMOS gate back-bias rail 32P, as opposed to requiring multiple instances of the PMOS gate back-bias rail 32P.

With continuing reference to FIG. 2, although the SOI CMOS standard library cell circuit 30 is described as including PMOS components, similar function may be achieved using NMOS components. For example, an NMOS gate back-bias rail could be implemented in place of the PMOS gate back-bias rail 32P. Such an NMOS gate back-bias rail would be disposed adjacent to NMOS channel regions rather than the PMOS channel regions 14P(1), 14P(2). Additionally, such an NMOS gate back-bias rail would be configured to apply an NMOS bias voltage to adjust the timing of NMOS transistors, as opposed to the PMOS bias voltage 24P used to adjust the timing of the PMOS transistors 12P(1), 12P(2).

Figure 3:
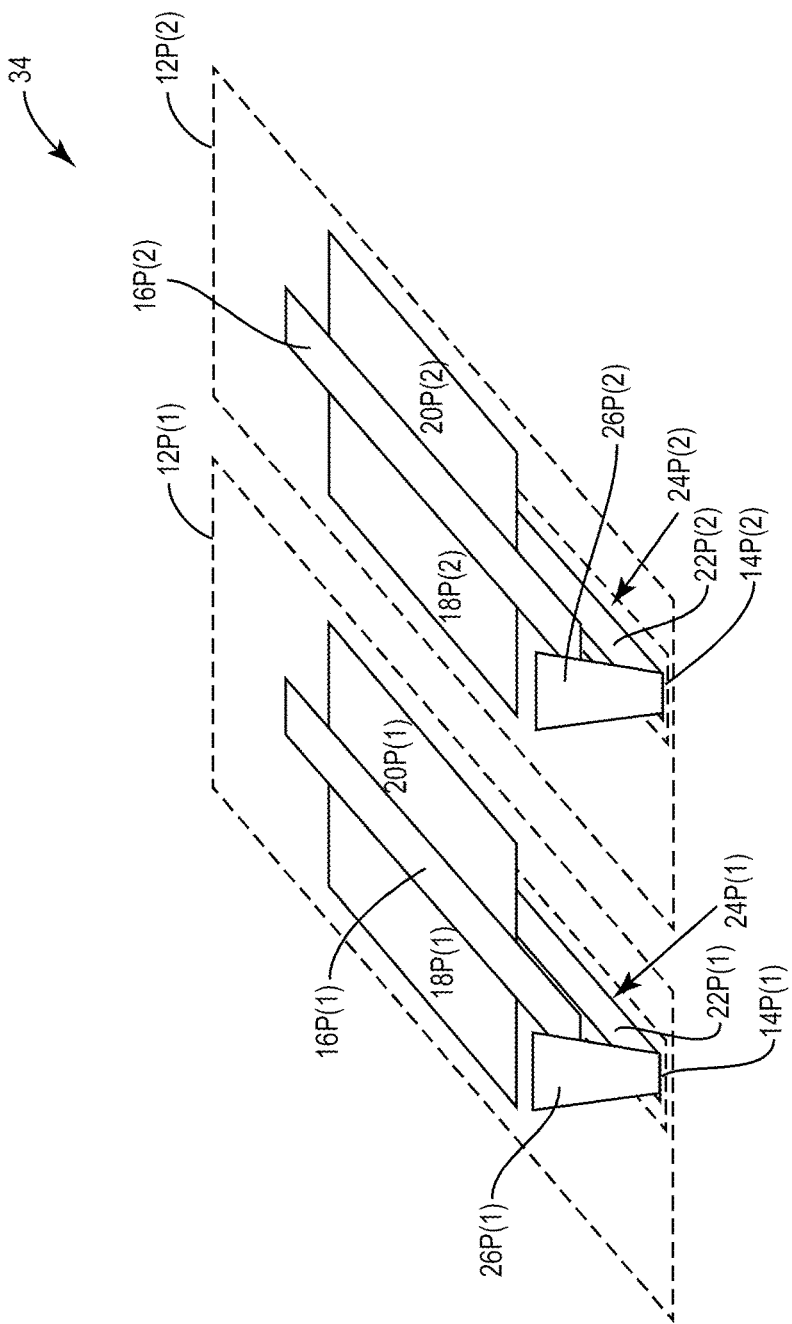
FIG. 3 is a perspective view diagram of two exemplary transistors for a SOI CMOS standard library cell circuit, wherein each transistor includes a separate gate back-bias rail configured to apply a bias voltage to a corresponding channel region so as to adjust a $V_t$ of each transistor individually.

While the SOI CMOS standard library cell circuit 30 in FIG. 2 illustrates the PMOS gate back-bias rail 32P configured to apply the PMOS bias voltage 24P to the PMOS transistors 12P(1), 12P(2), the PMOS transistors 12P(1), 12P(2) may also be biased with separate PMOS bias voltages 24P(1), 24P(2) for more granular timing control. In this regard, FIG. 3 illustrates a perspective view diagram of an exemplary SOI CMOS standard library cell circuit 34 that includes PMOS gate back-bias rails 22P(1), 22P(2) configured to apply the PMOS bias voltages 24P(1), 24P(2), respectively, so as to adjust the $V_{t\text{-}PMOS}$ of the PMOS transistors 12P(1), 12P(2) separately. Similar to FIG. 2, the PMOS transistors 12P(1), 12P(2) have corresponding gates 16P(1), 16P(2), sources 18P(1), 18P(2), and drains 20P(1), 20P(2). However, the PMOS gate back-bias rail 22P(1) is disposed adjacent to the PMOS channel region 14P(1), while the PMOS gate back-bias rail 22P(2) is disposed adjacent to the PMOS channel region 14P(2). Thus, the PMOS gate back-bias rail 22P(1) is configured to apply the PMOS bias voltage 24P(1) to the PMOS channel region 14P(1) to adjust the $V_{t\text{-}PMOS}$ of the PMOS transistor 12P(1). The PMOS gate back-bias rail 22P(2) is configured to apply the PMOS bias voltage 24P(2) to the PMOS channel region 14P(2) to adjust the $V_{t\text{-}PMOS}$ of the PMOS transistor 12P(2). Taps 26P(1), 26P(2) are included in the SOI CMOS standard library cell circuit 34 to provide the PMOS bias voltages 24P(1), 24P(2) to the PMOS gate back-bias rails 22P(1), 22P(2), respectively. In this manner, the timing of the PMOS transistors 12P(1), 12P(2) may be adjusted individually using the PMOS gate back-bias rails 22P(1), 22P(2) in order to achieve design timing targets of the SOI CMOS standard library cell circuit 34 with greater granularity.

With continuing reference to FIG. 3, although the SOI CMOS standard library cell circuit 34 is described as including PMOS components, similar function may be achieved using NMOS components. For example, NMOS gate back-bias rails could be implemented in place of the PMOS gate back-bias rails 22P(1), 22P(2). Such NMOS gate back-bias rails would be disposed adjacent to NMOS channel regions rather than the PMOS channel regions 14P(1), 14P(2). Additionally, such NMOS gate back-bias rails would be configured to apply NMOS bias voltages to adjust the timing of NMOS transistors, as opposed to the PMOS bias voltages 24P(1), 24P(2) used to adjust the timing of the PMOS transistors 12P(1), 12P(2), respectively.

Figure 4:
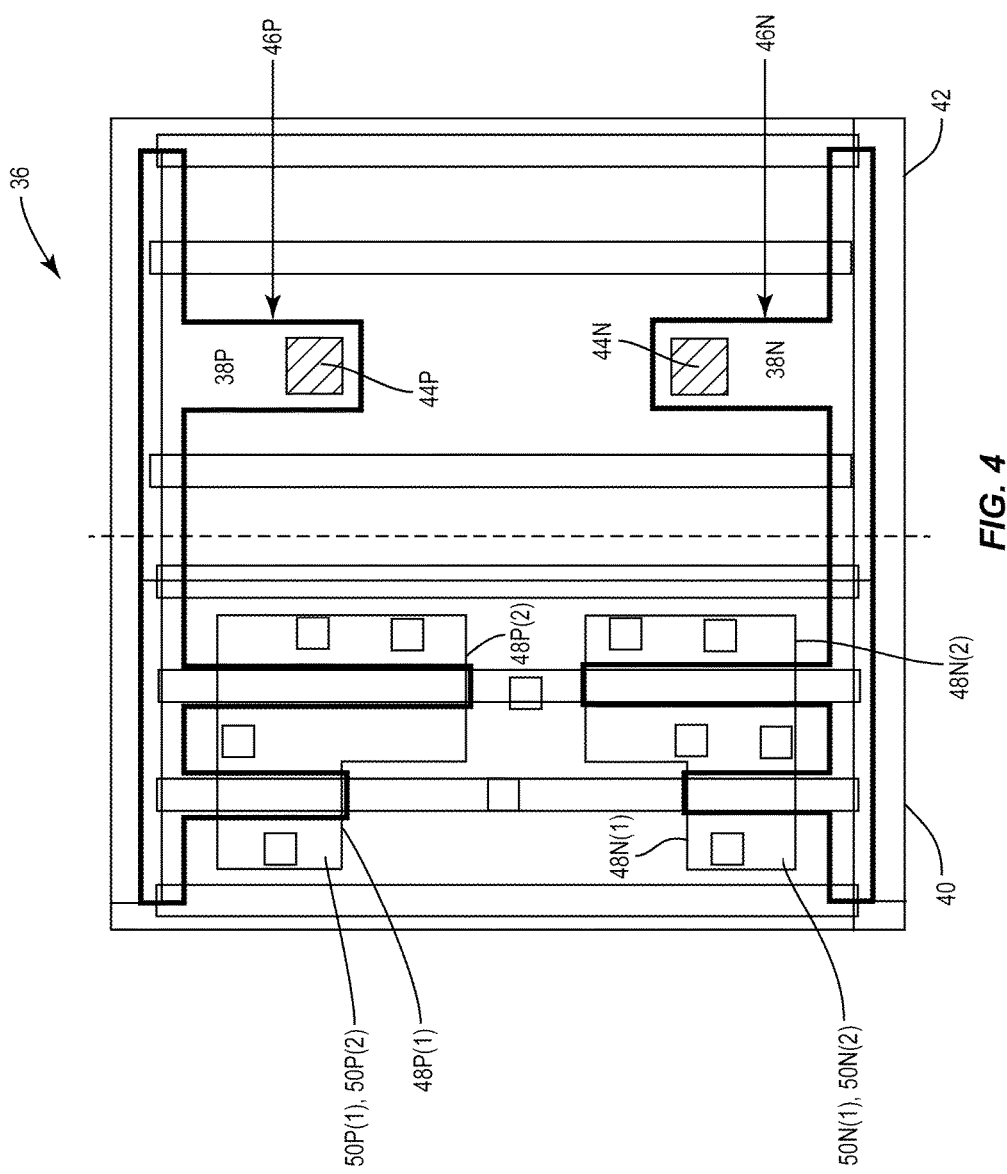
FIG. 4 is an exemplary layout design illustrating an exemplary SOI CMOS standard library NAND gate cell circuit employing PMOS and NMOS gate back-bias rails configured to apply bias voltages to corresponding channel regions within a standard library NAND gate cell, and a tie cell that couples the PMOS and NMOS gate back-bias rails to bias voltage supplies.

In this regard, FIG. 4 illustrates a layout design of an exemplary SOI CMOS standard library NAND gate cell circuit 36 employing a PMOS gate back-bias rail 38P and an NMOS gate back-bias rail 38N. The SOI CMOS standard library NAND gate cell circuit 36 includes a standard library NAND gate cell 40. A tie cell 42 is also included that couples the PMOS gate back-bias rail 38P and the NMOS gate back-bias rail 38N to a PMOS bias voltage source 44P and an NMOS bias voltage source 44N, respectively. More specifically, the PMOS gate back-bias rail 38P is coupled to the PMOS bias voltage source 44P in the tie cell 42. The PMOS bias voltage source 44P provides a PMOS bias voltage 46P to the PMOS gate back-bias rail 38P. Further, the PMOS gate back-bias rail 38P is disposed adjacent to PMOS channel regions 48P(1), 48P(2). The PMOS gate back-bias rail 38P is thus configured to apply the PMOS bias voltage 46P to the PMOS channel regions 48P(1), 48P(2) to adjust the $V_{t\text{-}PMOS}$ of associated PMOS transistors 50P(1), 50P(2). Similarly, the NMOS gate back-bias rail 38N is coupled to the NMOS bias voltage source 44N in the tie cell 42. The NMOS bias voltage source 44N provides an NMOS bias voltage 46N to the NMOS gate back-bias rail 38N. Further, the NMOS gate back-bias rail 38N is disposed adjacent to NMOS channel regions 48N(1), 48N(2). The NMOS gate back-bias rail 38N is thus configured to apply the NMOS bias voltage 46N to the NMOS channel regions 48N(1), 48N(2) to adjust the $V_{t\text{-}NMOS}$ of associated NMOS transistors 50N(1), 50N(2). In this manner, the timing of an IC employing the SOI CMOS standard library NAND gate cell circuit 36 may be adjusted without requiring the addition of timing closure elements in order to meet design timing targets of the IC.

While FIG. 4 illustrates employing the PMOS gate back-bias rail 38P and the NMOS gate back-bias rail 38N in the SOI CMOS standard library NAND gate cell circuit 36, the PMOS gate back-bias rail 38P and the NMOS gate back-bias rail 38N may be used for voltage biasing in other SOI CMOS standard library cell circuits. Further, in larger circuits, multiple instances of the tie cell 42 may need to be placed at periodic intervals within the circuit to achieve uniform voltage biasing.

Figure 5:
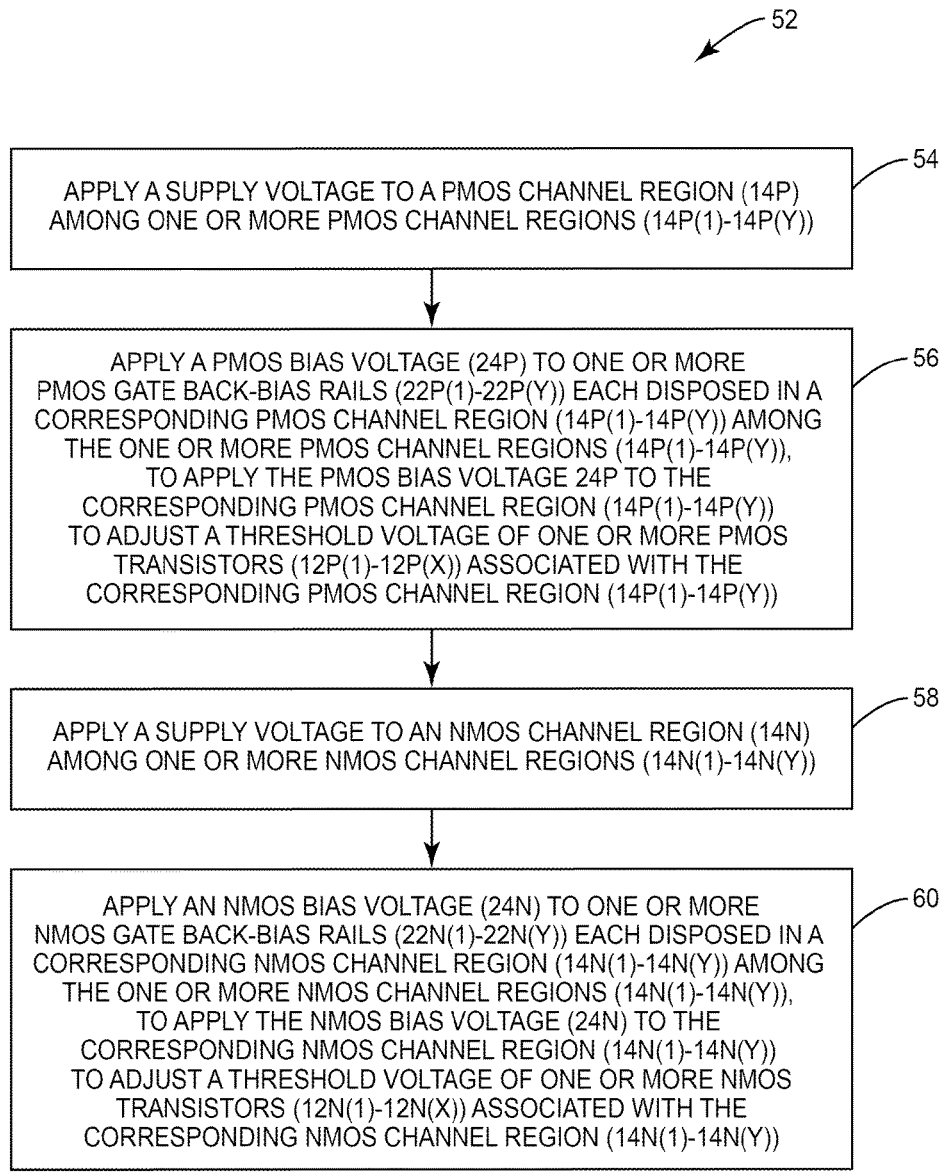
FIG. 5 is a flowchart illustrating an exemplary process for adjusting a $V_t$ of transistors within an SOI CMOS standard library cell using gate back-bias rails.

FIG. 5 illustrates an exemplary process 52 employed by a SOI CMOS standard library cell circuit, such as the SOI CMOS standard library cell circuit 10 in FIGS. 1A and 1B, to adjust the $V_{t\text{-}PMOS}$ of PMOS transistors 12P(1)-12P(X) and the $V_{t\text{-}NMOS}$ of NMOS transistors 12N(1)-12N(X), where 'X' equals the numbers of transistors of each type. With reference to FIG. 5, a supply voltage is applied to a PMOS channel region 14P among one or more PMOS channel regions 14P(1)-14P(Y) in the SOI CMOS standard library cell circuit 10, where 'Y' equals the number of channel regions of each type (block 54). Further, a PMOS bias voltage 24P is applied to one or more PMOS gate back-bias rails 22P(1)-22P(Y) each disposed adjacent to a corresponding PMOS channel region 14P(1)-14P(Y) among the one or more PMOS channel regions 14P(1)-14P(Y) (block 56). The PMOS bias voltage 24P is applied in this manner so as to apply the PMOS bias voltage 24P to the corresponding PMOS channel region 14P(1)-14P(Y) to adjust the $V_{t\text{-}PMOS}$ of one or more PMOS transistors 12P(1)-12P(X) associated with the corresponding PMOS channel region 14P(1)-14P(Y).

With continuing reference to FIG. 5, a supply voltage is also applied to the NMOS channel region 14N among one or more NMOS channel regions 14N(1)-14N(Y) in the SOI CMOS standard library cell circuit 10 (block 58). Further, an NMOS bias voltage 24N is applied to one or more NMOS gate back-bias rails 22N(1)-22N(Y) each disposed adjacent to a corresponding NMOS channel region 14N(1)-14N(Y) among the one or more NMOS channel regions 14N(1)-14N(Y) (block 60). The NMOS bias voltage 24N is applied in this manner so as to apply the NMOS bias voltage 24N to the corresponding NMOS channel region 14N(1)-14N(Y) to adjust the $V_{t\text{-}NMOS}$ of one or more NMOS transistors 12N(1)-12N(X) associated with the corresponding NMOS channel region 14N(1)-14N(Y). Notably, the steps described in blocks 54 and 58 may occur at any time during which the SOI CMOS standard library cell circuit 10 is powered, while the steps described in blocks 56 and 60 may occur during voltage biasing of the PMOS channel regions 14P(1)-14P(Y) and/or the NMOS channel regions 14N(1)-14N(Y). In this manner, the process 52 enables the SOI CMOS standard library cell circuit 10 to adjust the timing of the PMOS transistors 12P(1)-12P(X) and the NMOS transistors 12N(1)-12N(X) so as to achieve a design timing target without consuming additional area and power with timing closure elements.

Figure 6:
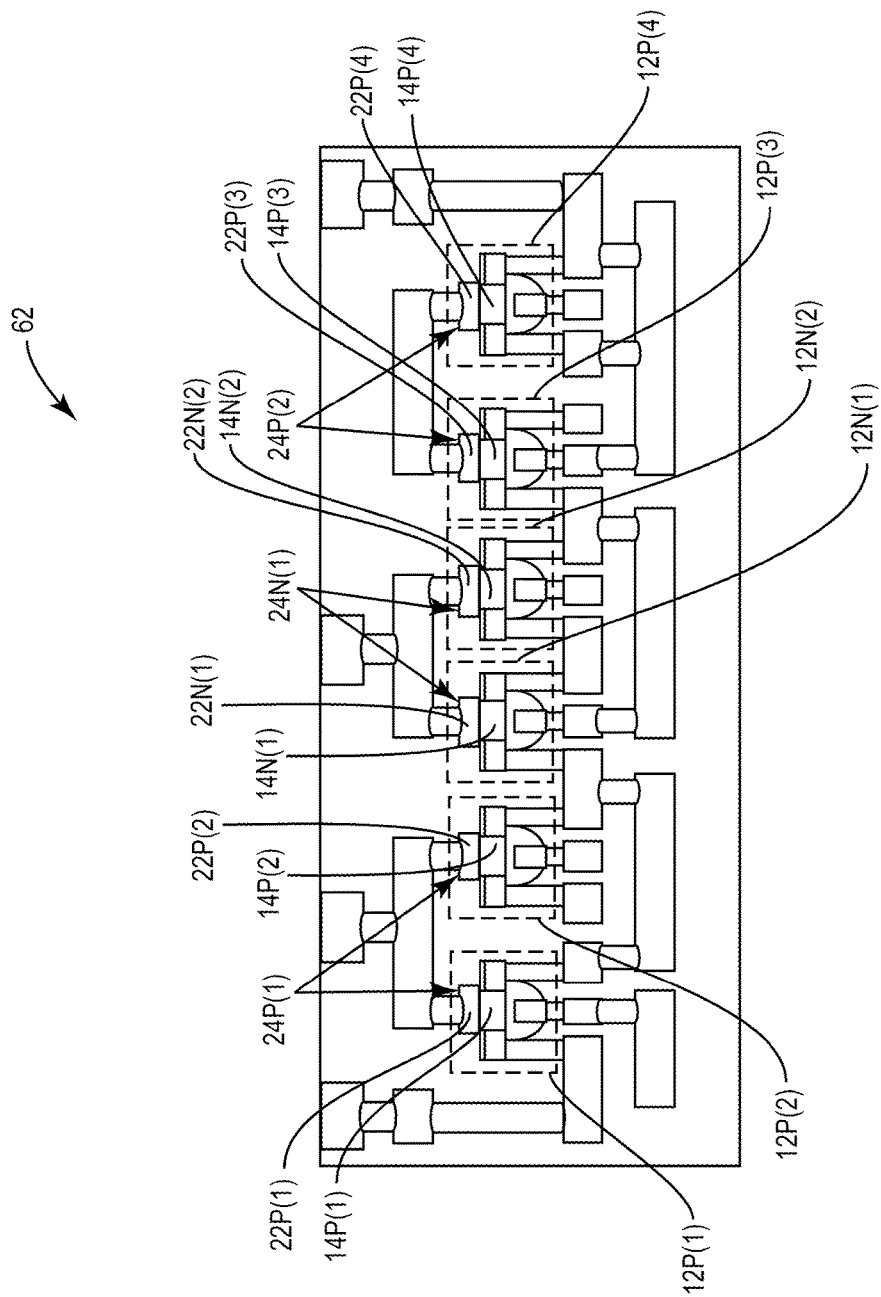
FIG. 6 is a block diagram of an exemplary two dimensional (2D) integrated circuit (IC) (2DIC) employing SOI CMOS standard library cell circuits that include gate back-bias rails configured to apply bias voltages to corresponding channel regions so as to adjust a $V_t$ of associated transistors.

It is important to note that design timing targets as discussed herein apply to both two dimensional (2D) ICs (2DICs) and three dimensional (3D) ICs (3DICs). In this regard, FIG. 6 illustrates a cross-sectional diagram of an exemplary 2DIC 62 employing multiple SOI CMOS standard library cell circuits, such as the SOI CMOS standard library cell circuit 10 in FIGS. 1A and 1B. Thus, similar to the SOI CMOS standard library cell circuit 10, each PMOS transistor 12P(1)-12P(4) in the 2DIC 62 includes a corresponding PMOS gate back-bias rail 22P(1)-22P(4). The PMOS gate back-bias rails 22P(1), 22P(2) are configured to apply a PMOS bias voltage 24P(1) to corresponding PMOS channel regions 14P(1), 14P(2) to adjust the $V_{t\text{-}PMOS}$ of PMOS transistors 12P(1), 12P(2). Further, the PMOS gate back-bias rails 22P(3), 22P(4) are configured to apply the PMOS bias voltage 24P(2) to corresponding PMOS channel regions 14P(3), 14P(4) to adjust the $V_{t\text{-}PMOS}$ of PMOS transistors 12P(3), 12P(4). Additionally, NMOS gate back-bias rails 22N(1), 22N(2) are configured to apply an NMOS bias voltage 24N(1) to corresponding NMOS channel regions 14N(1), 14N(2) to adjust the $V_{t\text{-}NMOS}$ of NMOS transistors 12N(1), 12N(2). In this manner, the 2DIC 62 may reach its design timing target through voltage biasing rather than adding area and power consuming timing closure elements.

Figure 7:
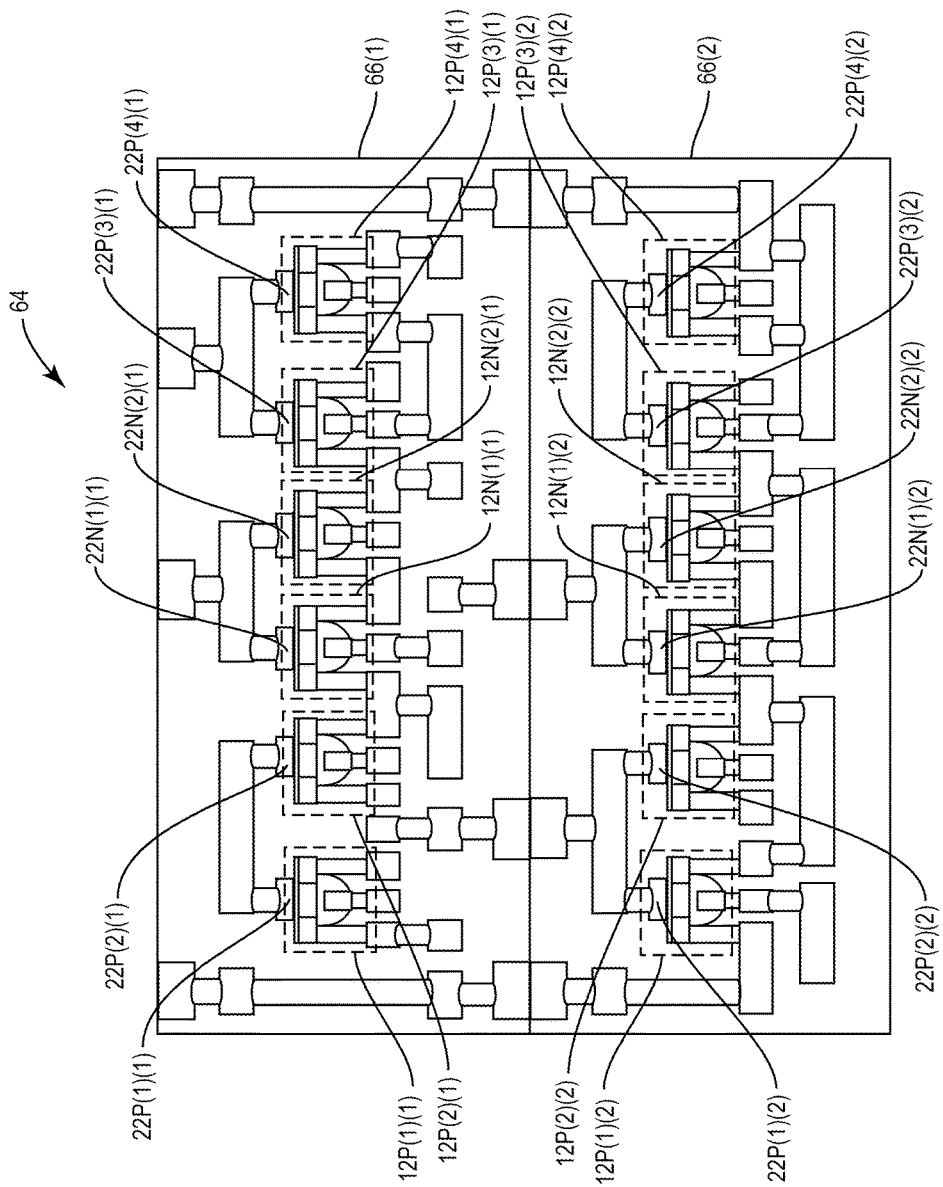
FIG. 7 is a block diagram of an exemplary three dimensional (3D) IC (3DIC) employing SOI CMOS standard library cell circuits that include gate back-bias rails configured to apply bias voltages to corresponding channel regions so as to adjust a $V_t$ of associated transistors.

Additionally, FIG. 7 illustrates a cross-sectional diagram of an exemplary 3DIC 64 employing multiple SOI CMOS standard library cell circuits, such as the SOI CMOS standard library cell circuit 10 in FIGS. 1A and 1B. In particular, the 3DIC 64 includes two tiers 66(1), 66(2). Because each tier 66(1), 66(2) may be manufactured on different silicon die, manufacturing process variations may cause the tiers 66(1), 66(2) to possess varying timing properties. However, each tier 66(1), 66(2) may adjust its timing independently of the other similar to the 2DIC 62 in FIG. 6. More specifically, the tier 66(1) may adjust the timing of PMOS transistors 12P(1)(1)-12P(4)(1) using each corresponding PMOS gate back-bias rail 22P(1)(1)-22P(4)(1). The tier 66(1) may also adjust the timing of NMOS transistors 12N(1)(1), 12N(2)(1) using each corresponding NMOS gate back-bias rail 22N(1)(1), 22N(2)(1). Similar timing adjustments may be made for the tier 66(2) by adjusting the timing of PMOS transistors 12P(1)(2)-12P(4)(2) and NMOS transistors 12N(1)(2)-12N(2)(2) using each corresponding PMOS gate back-bias rail 22P(1)(2)-22P(4)(2) and NMOS gate back-bias rail 22N(1)(2), 22N(2)(2), respectively.

Figure 8:
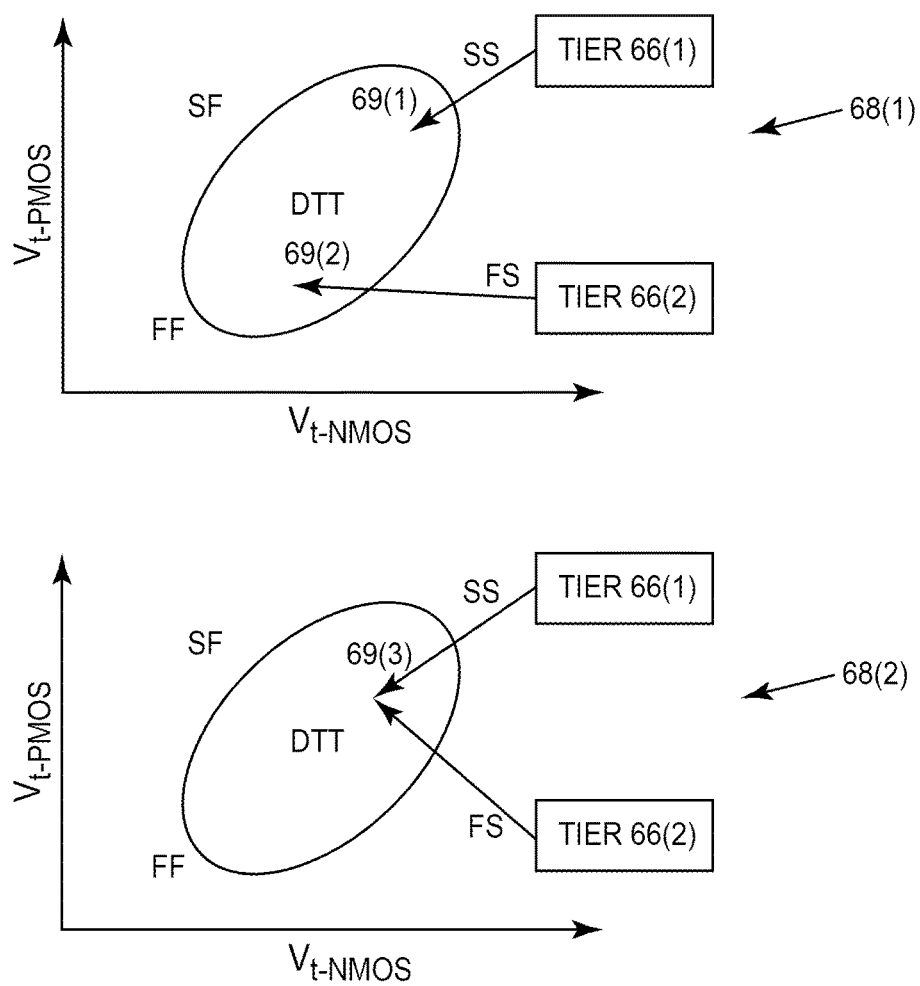
FIG. 8 illustrates timing graphs of exemplary tiers within a 3DIC employing SOI CMOS standard library cell circuits that include gate back-bias rails.

In this regard, FIG. 8 illustrates timing graphs 68(1), 68(2) of the tiers 66(1), 66(2) within the 3DIC 64 in FIG. 7. In particular, the timing graph 68(1) illustrates a scenario in which the timing of each tier 66(1), 66(2) is independently scaled to reach a design timing target, which is denoted as "DTT." Notably, such independent scaling is particularly useful when the tiers 66(1), 66(2) are asynchronous, as each tier 66(1), 66(2) may need to reach a different design timing target to satisfy the overall timing of the 3DIC 64. In this manner, the timing graph 68(1) illustrates that the tier 66(1) operates in the "SS" zone. Operation in the "SS" zone means that the PMOS transistors 12P(1)(1)-12P(4)(1) and the NMOS transistors 12N(1)(1)-12N(2)(1) have a "slow" operating speed due to a high $V_{t\text{-}PMOS}$ and high $V_{t\text{-}NMOS}$, respectively. By adjusting the timing of the PMOS transistors 12P(1)(1)-12P(4)(1) and the NMOS transistors 12N(1)(1)-12N(2)(1) through voltage biasing as previously described, the tier 66(1) timing may be adjusted independently of the tier 66(2) timing so that the tier 66(1) operates in a target 69(1) in the "DTT" zone, meaning that it meets the design timing target. Further, in the timing graph 68(1), the tier 66(2) operates in the "FS" zone, which indicates that the PMOS transistors 12P(1)(2)-12P(4)(2) have a "fast" operating speed due to a low $V_{t\text{-}PMOS}$, while the NMOS transistors 12N(1)(2)-12N(2)(2) have a "slow" operating speed due to a high $V_{t\text{-}NMOS}$. By adjusting the timing of the PMOS transistors 12P(1)(2)-12P(4)(2) and the NMOS transistors 12N(1)(2)-12N(2)(2) through voltage biasing as previously described, the tier 66(2) timing may be adjusted so that the tier 66(2) operates at a target 69(2) in the "DTT" zone, meeting the design timing target. Thus, when the tiers 66(1), 66(2) are asynchronous, the timing of each tier 66(1), 66(2) may be independently scaled through voltage biasing to help the 3DIC 64 achieve its design timing target without the addition of timing closure elements.

With continuing reference to FIG. 8, the timing graph 68(2) illustrates a scenario in which the timing of each tier 66(1), 66(2) is matched so as to reach an identical target 69(3) in the "DTT" zone, rather than being independently scaled as in the timing graph 68(1). Such tier match scaling is particularly useful when the tiers 66(1), 66(2) are synchronous, as the tiers 66(1), 66(2) may all need to achieve a design timing target within a specified range to satisfy the design timing target of the 3DIC 64. In this manner, similar to the timing graph 68(1), the tier 66(1) is initially in the "SS" zone, while the tier 66(2) is initially in the "FS" zone. By adjusting the timing of the PMOS transistors 12P(1)(1)-12P(4)(1), 12P(1)(2)-12P(4)(2) and the NMOS transistors 12N(1)(1)-12N(2)(1), 12N(1)(2)-12N(2)(2) through voltage biasing as previously described, the timing of each tier 66(1), 66(2) may be adjusted to match one another to meet the same design timing target at the identical target 69(3) in the "DTT" zone. Thus, when the tiers 66(1), 66(2) are synchronous, the timing of each tier 66(1), 66(2) may be scaled to match using voltage biasing to help the 3DIC 64 achieve its design timing target without the addition of timing closure elements.

Figure 9:
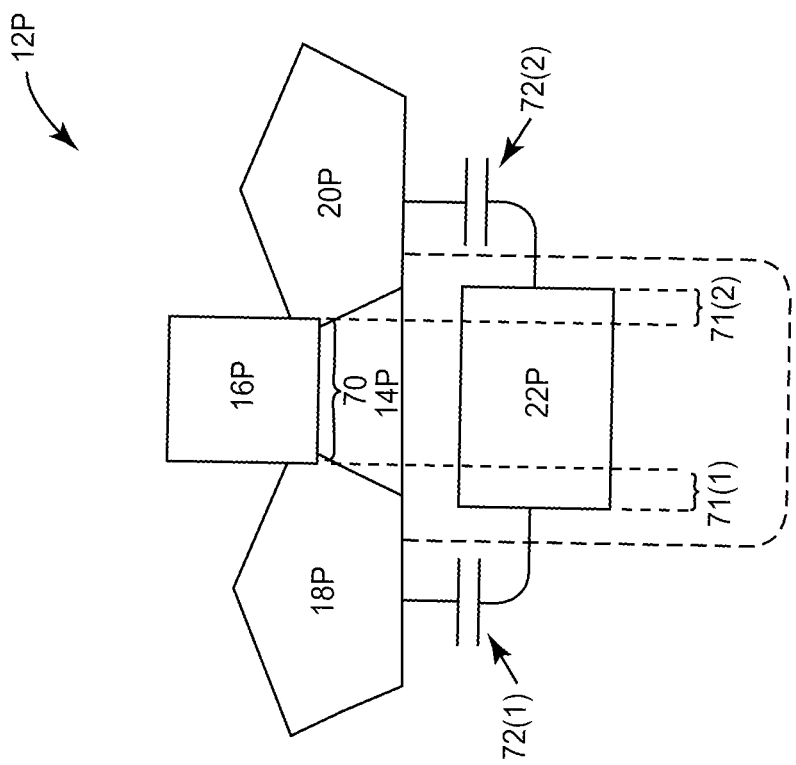
FIG. 9 is a cross-sectional diagram of an exemplary transistor for a SOI CMOS standard library cell circuit employing a gate back-bias rail illustrating a proportion of the gate back-bias rail in relation to a gate, a source, and a drain of the transistor.

Additionally, when employing voltage biasing as described above, the placement of the PMOS gate back-bias rails 22P, 32P, or 38P, or the NMOS gate back-bias rails 22N or 38N may affect the results of such voltage biasing. In this manner, FIG. 9 illustrates a cross-sectional diagram of the PMOS transistor 12P illustrating the placement of the PMOS gate back-bias rail 22P in relation to the gate 16P, source 18P, and drain 20P. The PMOS gate back-bias rail 22P is disposed adjacent to the PMOS channel region 14P. Rather than placing the PMOS gate back-bias rail 22P to align with a width 70 of the gate 16P, the PMOS gate back-bias rail 22P is placed so as to exceed the width 70 of the gate 16P. In particular, the PMOS gate back-bias rail 22P is placed so that it exceeds the width 70 of the gate 16P by distances 71(1) and 71(2), respectively. Such distances 71(1), 71(2) provide a margin to correct for possible mask misalignment during fabrication. In other words, placing the PMOS gate back-bias rail 22P so that it exceeds the width 70 of the gate 16P may allow the PMOS gate back-bias rail 22P to be used for voltage biasing as described above even if the masks used to fabricate the PMOS transistor 12P are misaligned during fabrication. However, when placing the PMOS gate back-bias rail 22P, the distances 71(1), 71(2) should be minimized to avoid capacitive coupling 72(1), 72(2) between the PMOS gate back-bias rail 22P and the source 18P and drain 20P, respectively, that may negatively impact performance of the PMOS transistor 12P. Notably, such placement is also applicable to the PMOS gate back-bias rails 32P and 38P, and the NMOS gate back-bias rails 22N and 38N.

In addition to using the PMOS and NMOS gate back-bias rails, such as those included in the SOI CMOS standard library cell circuit 10 as described above, to adjust the timing of PMOS and/or NMOS transistors, respectively, through voltage biasing, the PMOS and NMOS gate back-bias rails may also be used to create multiple $V_t$ devices on a single IC. In particular, an IC may employ multiple $V_t$ devices, such as nominal $V_t$, high/low $V_t$, and ultra-high/ultra-low $V_t$ devices. A design may use these multiple $V_t$ devices in order to take advantage of the power-performance trade-off supported by such devices. If voltage biasing is not used, an IC employing these five (5) types of $V_t$ devices requires four (4) additional mask layers during fabrication. Such additional mask layers increase the cost and power consumption of an IC. However, voltage biasing using the PMOS and NMOS gate back-bias rails as described above may be used to create multiple $V_t$ devices on a single IC while eliminating the need for the four (4) additional mask layers. Thus, using the PMOS and NMOS gate back-bias rails to create multiple $V_t$ devices may reduce the cost and power consumption of an IC.

Figure 10:
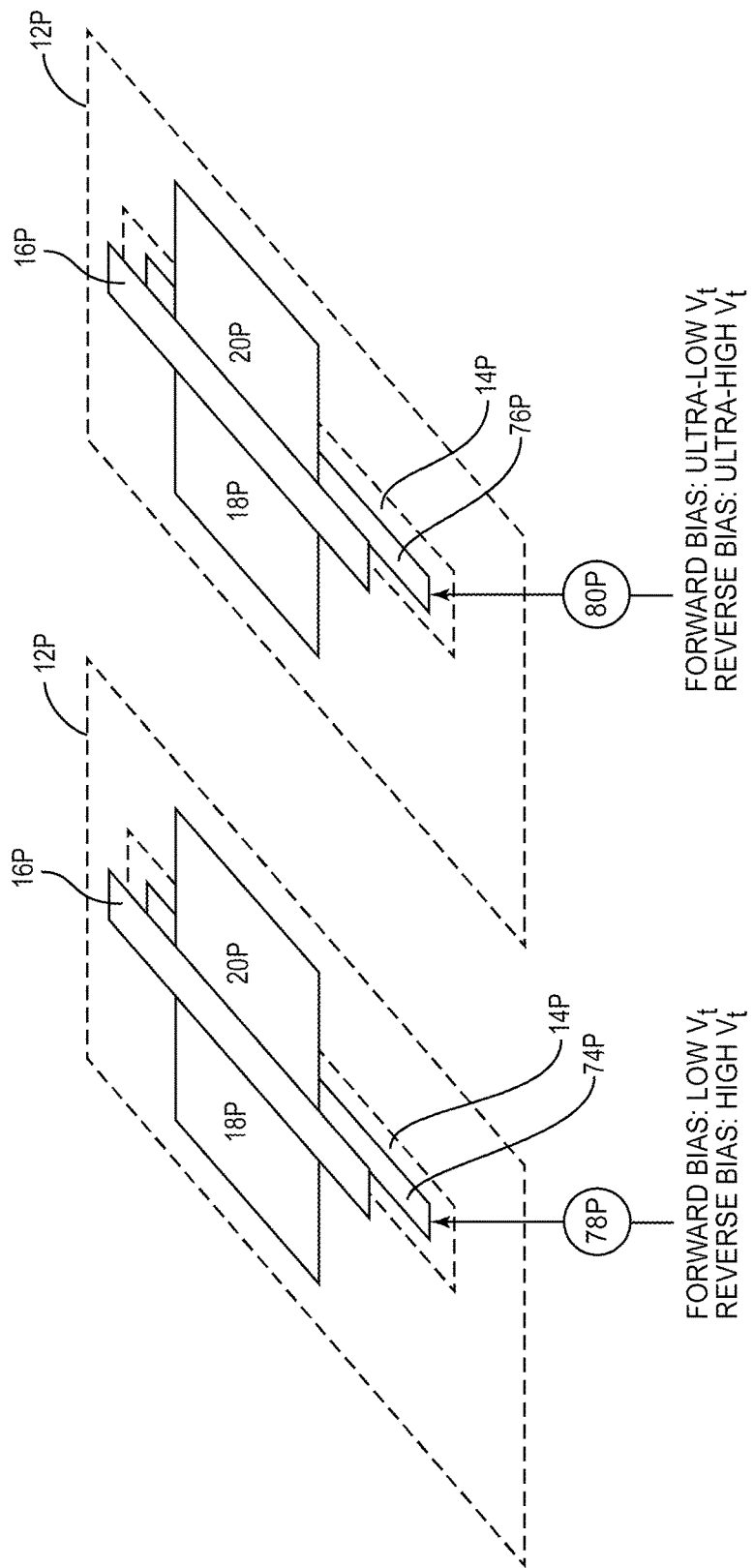
FIG. 10A is a perspective view diagram of an exemplary transistor for a SOI CMOS standard library cell circuit employing a gate back-bias rail to achieve a low $V_t$ or a high $V_t$.
FIG. 10B is a perspective view diagram of an exemplary transistor for a SOI CMOS standard library cell circuit employing a gate back-bias rail to achieve an ultra-low $V_t$ or an ultra-high $V_t$.

In this regard, FIG. 10A illustrates a perspective view diagram of the PMOS transistor 12P employing a first PMOS gate back-bias rail 74P disposed adjacent to the PMOS channel region 14P to achieve a low $V_t$ or a high $V_t$. Similarly, FIG. 10B illustrates a perspective view diagram of the PMOS transistor 12P employing a second PMOS gate back-bias rail 76P disposed adjacent to the PMOS channel region 14P to achieve an ultra-low $V_t$ or an ultra-high $V_t$. With reference to FIG. 10A, to voltage bias the PMOS transistor 12P so that it functions as a low $V_t$ device, the first PMOS gate back-bias rail 74P is configured to apply a first PMOS bias voltage 78P as a forward bias. To voltage bias the PMOS transistor 12P to function as a high $V_t$ device, the first PMOS gate back-bias rail 74P is configured to apply the first PMOS bias voltage 78P as a reverse bias. With reference to FIG. 10B, to voltage bias the PMOS transistor 12P so that it functions as an ultra-low $V_t$ device, the second PMOS gate back-bias rail 76P is configured to apply a second PMOS bias voltage 80P as a forward bias. To voltage bias the PMOS transistor 12P so that it functions as an ultra-high $V_t$ device, the second PMOS gate back-bias rail 76P is configured to apply the second PMOS bias voltage 80P as a reverse bias. Notably, in the example described above, the first PMOS bias voltage 78P must have a value less than the value of the second PMOS bias voltage 80P. Further, the PMOS transistor 12P may function as a nominal $V_t$ device when no voltage bias is applied. Thus, by using the first PMOS gate back-bias rail 74P and the second PMOS gate back-bias rail 76P to voltage bias the PMOS transistor 12P as described, an IC may employ nominal $V_t$, high/low $V_t$, and ultra-high/ultra-low $V_t$ devices using a single mask layer, which may reduce the IC's cost and power consumption.

Although the voltage biasing in FIGS. 10A and 10B is described using PMOS components, similar function may be achieved using NMOS components. For example, first and second NMOS gate back-bias rails could be implemented in place of the first and second PMOS gate back-bias rails 74P, 76P, respectively. Such first and second NMOS gate back-bias rails would be configured to apply a first NMOS bias voltage and a second NMOS bias voltage, respectively.

Figure 11:
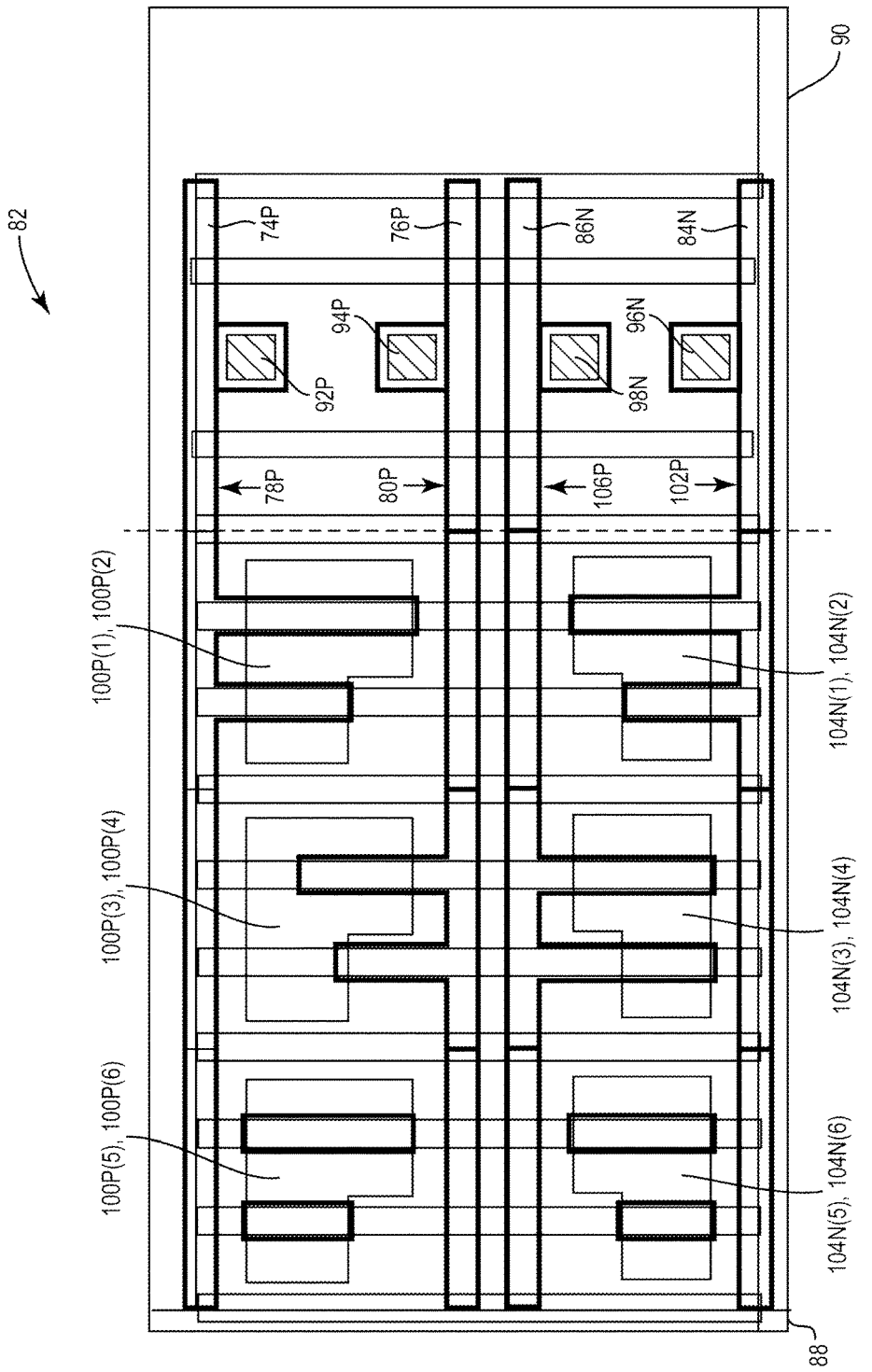
FIG. 11 is an exemplary layout design illustrating an SOI CMOS standard library cell circuit that includes a standard library cell configured to support low/high $V_t$ devices, ultra-low/ultra-high $V_t$ devices, and nominal $V_t$ devices, and a tie cell that couples bias voltages to the standard library cell.

In this regard, FIG. 11 illustrates a layout design of an exemplary SOI CMOS standard library cell circuit 82 employing the first PMOS gate back-bias rail 74P, the second PMOS gate back-bias rail 76P, a first NMOS gate back-bias rail 84N, and a second NMOS gate back-bias rail 86N. The SOI CMOS standard library cell circuit 82 includes a standard library cell 88 configured to support low/high $V_t$ devices, ultra-low/ultra-high $V_t$ devices, and nominal $V_t$ devices. A tie cell 90 is also included that couples the first PMOS gate back-bias rail 74P and the second PMOS gate back-bias rail 76P to a first PMOS bias voltage source 92P and a second PMOS bias voltage source 94P, respectively. The tie cell 90 also couples the first NMOS gate back-bias rail 84N and the second NMOS gate back-bias rail 86N to a first NMOS bias voltage source 96N and a second NMOS bias voltage source 98N, respectively.

With continuing reference to FIG. 11, the first PMOS bias voltage source 92P provides the first PMOS bias voltage 78P to the first PMOS gate back-bias rail 74P. The first PMOS gate back-bias rail 74P is thus configured to apply the first PMOS bias voltage 78P to adjust the $V_{t\text{-}PMOS}$ of associated PMOS transistors 100P(1), 100P(2). The second PMOS bias voltage source 94P provides the second PMOS bias voltage 80P to the second PMOS gate back-bias rail 76P. The second PMOS gate back-bias rail 76P is thus configured to apply the second PMOS bias voltage 80P to adjust the $V_{t\text{-}PMOS}$ of associated PMOS transistors 100P(3), 100P(4). The first PMOS bias voltage 78P has a value less than the value of the second PMOS bias voltage 80P, as previously described. Thus, when the first PMOS bias voltage 78P is applied to the PMOS transistors 100P(1), 100P(2) as a forward bias, the PMOS transistors 100P(1), 100P(2) operate as low $V_t$ devices. When the first PMOS bias voltage 78P is applied to the PMOS transistors 100P(1), 100P(2) as a reverse bias, the PMOS transistors 100P(1), 100P(2) operate as high $V_t$ devices. Similarly, when the second PMOS bias voltage 80P is applied to the PMOS transistors 100P(3), 100P(4) as a forward bias, the PMOS transistors 100P(3), 100P(4) operate as ultra-low $V_t$ devices. When the second PMOS bias voltage 80P is applied to the PMOS transistors 100P(3), 100P(4) as a reverse bias, the PMOS transistors 100P(3), 100P(4) operate as ultra-high $V_t$ devices.

With continuing reference to FIG. 11, the first NMOS gate back-bias rail 84N is coupled to the first NMOS bias voltage source 96N in the tie cell 90. The first NMOS bias voltage source 96N provides a first NMOS bias voltage 102N to the first NMOS gate back-bias rail 84N. The first NMOS gate back-bias rail 84N is thus configured to apply the first NMOS bias voltage 102N to adjust the $V_{t\text{-}NMOS}$ of associated NMOS transistors 104N(1), 104N(2). The second NMOS gate back-bias rail 86N is coupled to the second NMOS bias voltage source 98N in the tie cell 90. The second NMOS bias voltage source 98N provides a second NMOS bias voltage 106N to the second NMOS gate back-bias rail 86N. The second NMOS gate back-bias rail 86N is thus configured to apply the second NMOS bias voltage 106N to adjust the $V_{t\text{-}NMOS}$ of associated NMOS transistors 104N(3), 104N(4). As previously described, the first NMOS bias voltage 102N has a value less than the value of the second NMOS bias voltage 106N. Thus, when the first NMOS bias voltage 102N is applied to the NMOS transistors 104N(1), 104N(2) as a forward bias, the NMOS transistors 104N(1), 104N(2) operate as low $V_t$ devices. When the first NMOS bias voltage 102N is applied to the NMOS transistors 104N(1), 104N(2) as a reverse bias, the NMOS transistors 104N(1), 104N(2) operate as high $V_t$ devices. Similarly, when the second NMOS bias voltage 106N is applied to the NMOS transistors 104N(3), 104N(4) as a forward bias, the NMOS transistors 104N(3), 104N(4) operate as ultra-low $V_t$ devices. When the second NMOS bias voltage 106N is applied to the NMOS transistors 104N(3), 104N(4) as a reverse bias, the NMOS transistors 104N(3), 104N(4) operate as ultra-high $V_t$ devices.

With continuing reference to FIG. 11, because no bias voltage is applied to PMOS transistors 100P(5), 100P(6) or NMOS transistors 104N(5), 104N(6), the PMOS transistors 100P(5), 100P(6) and the NMOS transistors 104N(5), 104N(6) operate as nominal $V_t$ devices. Thus, by employing the SOI CMOS standard library cell circuit 82 as previously described, an IC may include multiple $V_t$ devices using a single mask layer. In particular, an IC employing the SOI CMOS standard library cell circuit 82 may include low/high $V_t$ devices, ultra-low/ultra-high $V_t$ devices, and nominal $V_t$ devices. In this manner, employing the SOI CMOS standard library cell circuit 82 may reduce the IC's cost and power consumption.

The SOI CMOS standard library cell circuits having a gate back-bias rail(s) according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 12:
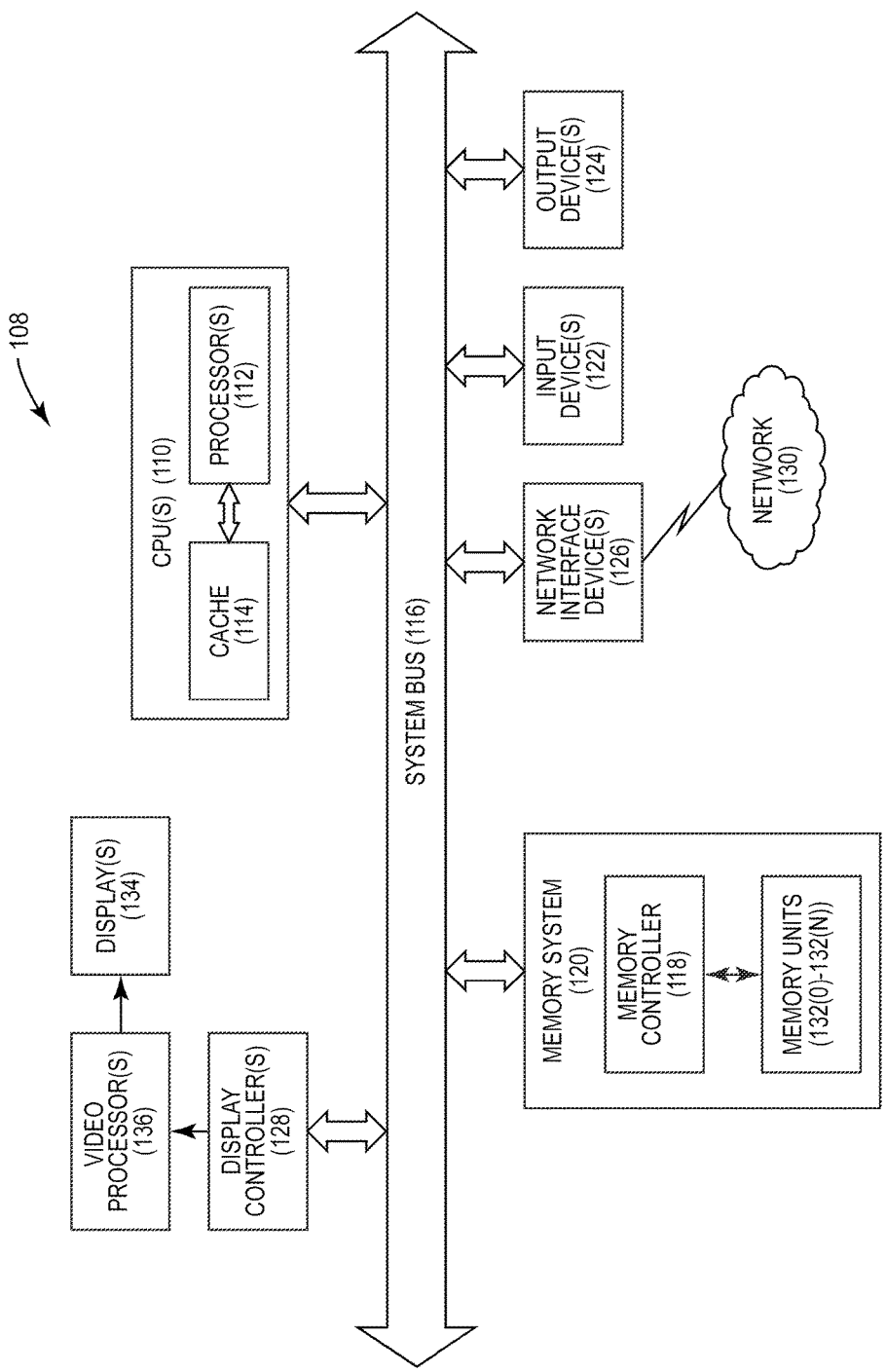
FIG. 12 is a block diagram of an exemplary processor-based system that can include the SOI CMOS standard library cell circuit in FIG. 1.

In this regard, FIG. 12 illustrates an example of a processor-based system 108 that can employ SOI CMOS standard library cell circuits, such as the SOI CMOS standard library cell circuit 10 illustrated in FIGS. 1A and 1B. In this example, the processor-based system 108 includes one or more central processing units (CPUs) 110, each including one or more processors 112. The CPU(s) 110 may have cache memory 114 coupled to the processor(s) 112 for rapid access to temporarily stored data. The CPU(s) 110 is coupled to a system bus 116 and can intercouple master and slave devices included in the processor-based system 108. As is well known, the CPU(s) 110 communicates with these other devices by exchanging address, control, and data information over the system bus 116. For example, the CPU(s) 110 can communicate bus transaction requests to a memory controller 118 as an example of a slave device. Although not illustrated in FIG. 12, multiple system buses 116 could be provided, wherein each system bus 116 constitutes a different fabric.

Other master and slave devices can be connected to the system bus 116. As illustrated in FIG. 12, these devices can include a memory system 120, one or more input devices 122, one or more output devices 124, one or more network interface devices 126, and one or more display controllers 128, as examples. The input device(s) 122 can include any type of input device, including but not limited to input keys, switches, voice processors, etc. The output device(s) 124 can include any type of output device, including but not limited to audio, video, other visual indicators, etc. The network interface device(s) 126 can be any devices configured to allow exchange of data to and from a network 130. The network 130 can be any type of network, including but not limited to a wired or wireless network, a private or public network, a local area network (LAN), a wide local area network (WLAN), and the Internet. The network interface device(s) 126 can be configured to support any type of communications protocol desired. The memory system 120 can include one or more memory units 132(0)-132(N).

The CPU(s) 110 may also be configured to access the display controller(s) 128 over the system bus 116 to control information sent to one or more displays 134. The display controller(s) 128 sends information to the display(s) 134 to be displayed via one or more video processors 136, which process the information to be displayed into a format suitable for the display(s) 134. The display(s) 134 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A silicon-on-insulator (SOI) complementary metal oxide semiconductor (CMOS) cell circuit, comprising one or more standard library cells, each of the one or more standard library cells comprising:

one or more p-type metal oxide semiconductor (PMOS) channel regions having a PMOS channel width;

one or more PMOS transistors, each of the one or more PMOS transistors comprising a PMOS gate, a PMOS source, and a PMOS drain, where a distance between the PMOS source and the PMOS drain defines the PMOS channel width, each of the one or more PMOS transistors associated with one of the one or more PMOS channel regions;

one or more PMOS supply rails each configured to provide a supply voltage to a PMOS channel region among the one or more PMOS channel regions;

one or more n-type metal oxide semiconductor (NMOS) channel regions having an NMOS channel width;
one or more NMOS transistors, each of the one or more NMOS transistors comprising an NMOS gate, an NMOS source, and an NMOS drain, where a distance between the NMOS source and the NMOS drain defines the NMOS channel width, each of the one or more NMOS transistors associated with one of the one or more NMOS channel regions;
one or more NMOS supply rails each configured to provide the supply voltage to an NMOS channel region among the one or more NMOS channel regions;
one or more PMOS gate back-bias rails each disposed in a corresponding PMOS channel region among the one or more PMOS channel regions, wherein each of the one or more PMOS gate back-bias rails has a width less than the PMOS channel width,
each of the one or more PMOS gate back-bias rails configured to apply a PMOS bias voltage only to the corresponding PMOS channel region to adjust a threshold voltage of the one or more PMOS transistors associated with the corresponding PMOS channel region; and
one or more NMOS gate back-bias rails each disposed in a corresponding NMOS channel region among the one or more NMOS channel regions, wherein each of the one or more NMOS gate back-bias rails has a width less than the NMOS channel width,
each of the one or more NMOS gate back-bias rails configured to apply an NMOS bias voltage only to the corresponding NMOS channel region to adjust a threshold voltage of the one or more NMOS transistors associated with the corresponding NMOS channel region.

2. The SOI CMOS cell circuit of claim 1, wherein:
each of the one or more PMOS gate back-bias rails is configured to apply a corresponding PMOS bias voltage to the corresponding PMOS channel region to adjust a threshold voltage of a PMOS transistor associated with the corresponding PMOS channel region; and
each of the one or more NMOS gate back-bias rails is configured to apply a corresponding NMOS bias voltage to the corresponding NMOS channel region to adjust a threshold voltage of an NMOS transistor associated with the corresponding NMOS channel region.

3. The SOI CMOS cell circuit of claim 1, wherein:
each of the one or more PMOS gate back-bias rails is comprised of metal; and
each of the one or more NMOS gate back-bias rails is comprised of metal.

4. The SOI CMOS cell circuit of claim 1, wherein:
each of the one or more PMOS gate back-bias rails is comprised of polysilicon; and
each of the one or more NMOS gate back-bias rails is comprised of polysilicon.

5. The SOI CMOS cell circuit of claim 1, wherein:
the one or more PMOS gate back-bias rails comprise a first PMOS gate back-bias rail and
a second PMOS gate back-bias rail, wherein:
the first PMOS gate back-bias rail is configured to apply a first PMOS bias voltage to the corresponding PMOS channel region to adjust the threshold voltage of the one or more PMOS transistors associated with the corresponding PMOS channel region; and
the second PMOS gate back-bias rail is configured to apply a second PMOS bias voltage to the corresponding PMOS channel region different from the PMOS channel region corresponding to the first PMOS gate back-bias rail to adjust the threshold voltage of the one or more PMOS transistors associated with the corresponding PMOS channel region; and
the one or more NMOS gate back-bias rails comprise a first NMOS gate back-bias rail and a second NMOS gate back-bias rail, wherein:
the first NMOS gate back-bias rail is configured to apply a first NMOS bias voltage to the corresponding NMOS channel region to adjust the threshold voltage of the one or more NMOS transistors associated with the corresponding NMOS channel region; and
the second NMOS gate back-bias rail is configured to apply a second NMOS bias voltage to the corresponding NMOS channel region different from the NMOS channel region corresponding to the first NMOS gate back-bias rail to adjust the threshold voltage of the one or more NMOS transistors associated with the corresponding NMOS channel region.

6. The SOI CMOS cell circuit of claim 1 integrated into an integrated circuit (IC).

7. The SOI CMOS cell circuit of claim 1 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

8. An integrated circuit (IC) chip, comprising:
a plurality of ICs, wherein each IC of the plurality of ICs comprises:
a plurality of silicon-on-insulator (SOI) complementary metal oxide semiconductor (CMOS) standard library cell circuits, comprising one or more standard library cells, each of the one or more standard library cells comprising:
one or more p-type metal oxide semiconductor (PMOS) channel regions having a PMOS channel width;
one or more PMOS transistors, each of the one or more PMOS transistors comprising a PMOS gate, a PMOS source, and a PMOS drain, where a distance between the PMOS source and the PMOS drain defines the PMOS channel width, each of the one or more PMOS transistors associated with one of the one or more PMOS channel regions;
one or more PMOS supply rails each configured to provide a supply voltage to a PMOS channel region among the one or more PMOS channel regions;
one or more n-type metal oxide semiconductor (NMOS) channel regions having an NMOS channel width;
one or more NMOS transistors, each of the one or more NMOS transistors comprising an NMOS gate, an NMOS source, and an NMOS drain, where a distance between the NMOS source and the NMOS drain defines the NMOS channel width, each of the one or more NMOS transistors associated with one of the one or more NMOS channel regions;

one or more NMOS supply rails each configured to provide the supply voltage to an NMOS channel region among the one or more NMOS channel regions;

one or more PMOS gate back-bias rails each disposed in a corresponding PMOS channel region among the one or more PMOS channel regions, wherein each of the one or more PMOS gate back-bias rails has a width less than the PMOS channel width, each of the one or more PMOS gate back-bias rails configured to apply a PMOS bias voltage only to the corresponding PMOS channel region to adjust a threshold voltage of the one or more PMOS transistors associated with the corresponding PMOS channel region; and one or more NMOS gate back-bias rails each disposed in a corresponding NMOS channel region among the one or more NMOS channel regions, wherein each of the one or more NMOS pate back-bias rails has a width less than the NMOS channel width, each of the one or more NMOS gate back-bias rails configured to apply an NMOS bias voltage only to the corresponding NMOS channel region to adjust a threshold voltage of the one or more NMOS transistors associated with the corresponding NMOS channel region.

9. The IC chip of claim 8, wherein the one or more PMOS gate back-bias rails comprise a first PMOS gate back-bias rail and a second PMOS gate back-bias rail, wherein:

the first PMOS gate back-bias rail is configured to apply a first PMOS bias voltage to the corresponding PMOS channel region to adjust the threshold voltage of the one or more PMOS transistors associated with the corresponding PMOS channel region; and the second PMOS gate back-bias rail is configured to apply a second PMOS bias voltage to the corresponding PMOS channel region different from the PMOS channel region corresponding to the first PMOS gate back-bias rail to adjust the threshold voltage of the one or more PMOS transistors associated with the corresponding PMOS channel region; and the one or more NMOS gate back-bias rails comprise a first NMOS gate back-bias rail and a second NMOS gate back-bias rail, wherein:

the first NMOS gate back-bias rail is configured to apply a first NMOS bias voltage to the corresponding NMOS channel region to adjust the threshold voltage of the one or more NMOS transistors associated with the corresponding NMOS channel region; and the second NMOS gate back-bias rail is configured to apply a second NMOS bias voltage to the corresponding NMOS channel region different from the NMOS channel region corresponding to the first NMOS gate back-bias rail to adjust the threshold voltage of the one or more NMOS transistors associated with the corresponding NMOS channel region.

* * * * *